United States Patent [19]

Kato et al.

[11] Patent Number: 4,759,965

[45] Date of Patent: Jul. 26, 1988

[54] CERAMIC, PREPARATION THEREOF AND ELECTRONIC CIRCUIT SUBSTRATE BY USE THEREOF

[75] Inventors: Keiichi Kato, Hiratsuka; Motoo Kumagai, Yokohama, both of Japan

[73] Assignee: Canon Kabushiki Kaisha, Tokyo, Japan

[21] Appl. No.: 892,320

[22] Filed: Aug. 4, 1986

[30] Foreign Application Priority Data

| Aug. 6, 1985 | [JP] | Japan | 60-171862 |
| Aug. 6, 1985 | [JP] | Japan | 60-171863 |
| Dec. 2, 1985 | [JP] | Japan | 60-271095 |
| Dec. 3, 1985 | [JP] | Japan | 60-270663 |
| Dec. 3, 1985 | [JP] | Japan | 60-270664 |
| Dec. 3, 1985 | [JP] | Japan | 60-270665 |
| Dec. 6, 1985 | [JP] | Japan | 60-274568 |
| Dec. 7, 1985 | [JP] | Japan | 60-275489 |
| Dec. 8, 1985 | [JP] | Japan | 60-275829 |
| Jun. 23, 1986 | [JP] | Japan | 61-144992 |

[51] Int. Cl.$^4$ .......................... B32B 3/10; B32B 3/00; C03C 10/04; C03C 8/14

[52] U.S. Cl. ..................... 428/138; 428/209; 428/210; 428/212; 428/901; 501/5; 501/17; 501/18; 501/22; 501/62; 501/74

[58] Field of Search ............. 428/138, 209, 210, 212, 428/901; 501/5, 17, 18, 22, 62, 74

[56] References Cited

U.S. PATENT DOCUMENTS

| 4,424,251 | 1/1984 | Sugishita et al. | 428/209 |
| 4,582,745 | 4/1986 | Schnable | 428/209 |
| 4,608,316 | 8/1986 | Toda et al. | 428/446 |
| 4,609,582 | 9/1986 | Joorman et al. | 428/138 |

Primary Examiner—John E. Kittle
Assistant Examiner—Patrick J. Ryan
Attorney, Agent, or Firm—Fitzpatrick, Cella, Harper and Scinto

[57] ABSTRACT

A ceramic comprises therein two or more dielectric portions having different dielectric constants formed by filling of one or more vacant spaces provided within a dielectric porcelain, a semiconductor porcelain as a precursor of said dielectric porcelain or a molded product as a precursor of said semiconductor procelain with one or more kinds of materials capable of becoming to have different dielectric constants from said dielectric porcelain and subsequent calcination.

61 Claims, 27 Drawing Sheets

FIG. 13
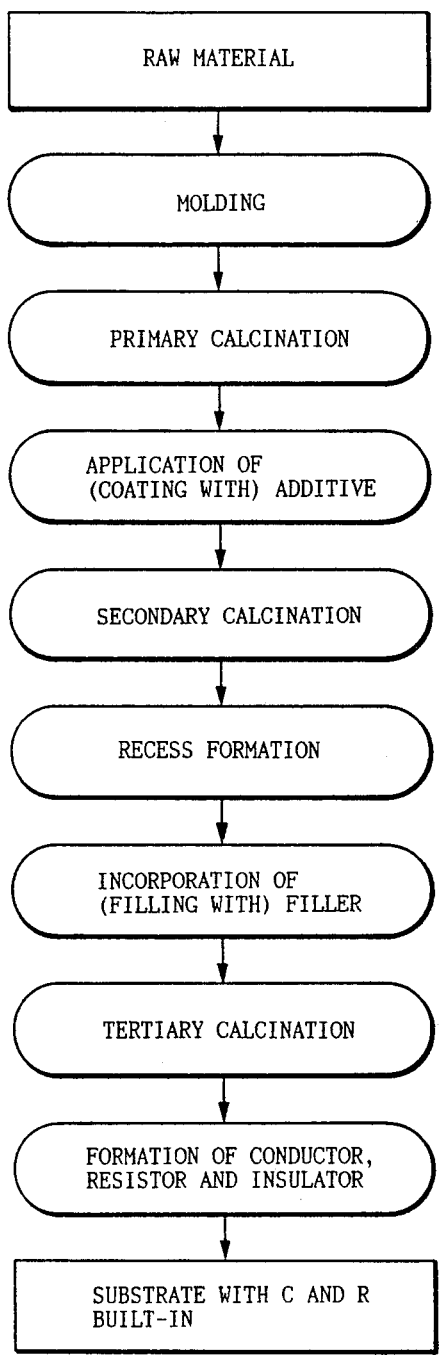
FIG. 14A
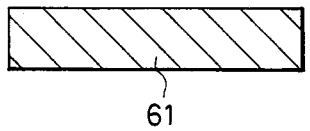
FIG. 14B
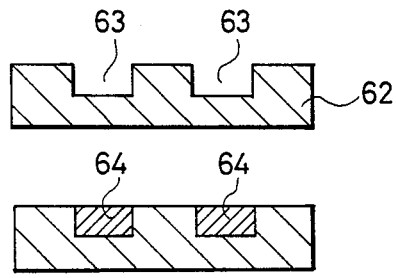
FIG. 14C

CERAMIC, PREPARATION THEREOF AND ELECTRONIC CIRCUIT SUBSTRATE BY USE THEREOF

BACKGROUND OF THE INVENTION

1. Field of the Invention

This invention relates to a ceramic, particularly to a ceramic which can be utilized as electronic materials including materials for electronic parts such as ceramic capacitors, etc., or electronic circuit substrates having electronic parts built therein such as capacitor built-in ceramic substrates, a method for producing the ceramic and also an electronic circuit substrate utilizing the ceramic.

2. Related Background Art

In the prior art, an electronic circuit substrate using ceramics is generally directed to an insulator substrate provided with conductor circuits and resistor portions, and electronic parts such as a capacitor are usually mounted as chip parts on such an insulator substrate. FIG. 1 shows an example of such an electronic circuit substrate, in which 121 is a ceramic insulator substrate, 122 a conductor circuit, 123 a resistor, 124 an insulating layer for a cover and 125 a chip capacitor.

However, when a chip part such as a capacitor is mounted externally of a substrate as shown in FIG. 1, the substrate becomes bulky and restrictions will be naturally imposed on circuit design in order to ensure the mounting site for the chip part. Accordingly, such a construction cannot sufficiently cope with the demand for miniaturization of electronic circuits in recent years.

On the other hand, as to an electronic part using ceramics, for example, the technique for producing a solid capacitor which primarily uses a barium titanate type sintered product porcelain has been developed, where starting materials are subjected to primary calcination with impurities to be made into a semiconductor and then subjected to secondary calcination using as a diffusion source a metal or a metal oxide to be converted into a dielectric. However, concerning the application of such a capacitor, no technique for assembling a plural number of capacitors into a single circuit substrate has been established except for using this technique as a chip. Thus, under the present situation, it has not sufficiently contributed to miniaturization of a circuit substrate.

Also, as to a capacitor of this kind, it is known as an example in recent years that the technique of a laminated ceramic capacitor has been developed and a resistor-and-capacitor built-in substrate is fabricated by mounting conductor circuits and resistor portions on its surface. In such a substrate, the characteristic range of a capacitor which can be built in is restricted by the dielectric material constituting the substrate. If desired circuit constants are within the range of this restriction, the use of such a substrate is very effective in miniaturization of electronic circuit.

However, this substrate involves serious drawbacks. The first problem is cost. More specifically, since the means for forming a capacitor involves the lamination of ceramics, the production equipment is cumbersome, whereby a large number of steps are required. Also, it is necessary to employ a large amount of relatively expensive electrode materials.

The next problem relates to circuit constitution.

In the case of forming a plural number of capacitor constituting units within a single substrate, they must be formed by laminating plural kinds of dielectric materials in combination. However, the types of circuits to which this technique can be applied have been limited.

Further, in a laminated ceramic capacitor, two thru-holes are required for one capacitor unit. For this reason, a capacitor built-in substrate of this type has a very large number of thru-holes, thus having the drawback of leading to the increase of substrate area.

FIG. 2 shows a ceramic substrate of this type, in which 121-123 have the same meanings as in FIG. 1, 126 and 127 are laminated type capacitor constituting units built in the substrate, 128 is a chip part mounted on the substrate and 129 is a thru-hole.

Thus, also in the case of providing a plurality of capacitor units built in a substrate through utilization of a laminated ceramic capacitor, there are serious restrictions not only with respect to the cost, but also with respect to the demand for circuit miniaturization and the degree of freedom in circuit design.

SUMMARY OF THE INVENTION

An object of the present invention is to provide a ceramic capable of having a plurality of functional portions built therein which are sufficiently separated from one another.

Another object of the present invention is to provide a method for producing a ceramic capable of forming a plurality of functional portions therein which are in a sufficiently separated state from each other.

It is also another object of the present invention to provide an electronic circuit substrate capable of having a plurality of electronic part constituting units built therein in a sufficiently separated state from one another as the device-functional portions thereof due to being constituted of a ceramic capable of having a plurality of functional portions built therein under a sufficiently separated state as mentioned above.

According to an aspect of the present invention, there is provided a ceramic comprising therein two or more dielectric portions having different dielectric constants formed by filling of one or more vacant spaces provided within a dielectric porcelain (a semiconductor porcelain as a precursor of the dielectric porcelain or a molded product as a precursor of said semiconductor porcelain) with one or more kinds of materials capable of developing different dielectric constants from the dielectric porcelain and subsequent calcination.

According to another aspect of the present invention, there is provided a ceramic comprising therein two or more dielectric portions having different dielectric constants formed by packing of two or more kinds of ceramic forming grain groups capable of developing different dielectric constants into a mold and separated from one another by use of partition plates, and subsequently calcinating the ceramic forming grain groups.

According to still another aspect of the present invention, there is provided a ceramic comprising therein two or more dielectric portions having different dielectric constants formed by diffusion into a dielectric porcelain of a diffusion source material capable of lowering the dielectric constant of the dielectric porcelain.

According to further aspect of the present invention, there is provided a ceramic comprising therein two or more dielectric portions having different dielectric constants formed by application of melting within a dielectric porcelain, a semiconductor porcelain as a precursor of the dielectric porcelain or a molded product as a precursor of the semiconductor porcelain.

According to a still further aspect of the present invention, there is provided a ceramic comprising therein two or more dielectric portions having different dielectric constants due to the difference in the content of a component necessary for conversion into a semiconductor.

According to still another aspect of the present invention, there is provided a ceramic comprising therein two or more dielectric portions having different dielectric constants due to the difference in the size of its constituent grains.

According to still further aspect of the present invention, there is provided a ceramic comprising therein two or more dielectric portions having different dielectric constants due to the difference in the density of the constituent materials.

There are also provided, according to an aspect of the present invention, electronic circuit substrates utilizing the above-mentioned ceramics.

Furthermore, there are also provided, according to an aspect of the present invention, methods for producing the above-mentioned ceramics.

BRIEF DESCRIPTION OF THE DRAWINGS

FIGS. 9, 11, 13, 16, 18, 20, 22, 25, 38, 40, 42, 49, 51, 54, 57, 58, 59, 60, 63 and 66 are each flow charts showing the preparation of the electronic circuit substrate of the present invention.

FIG. 12A and FIG. 14A are schematic sectional views of the molded product, FIG. 12B and FIG. 14B are schematic sectional views of the above molded product having concavities formed thereon, FIG. 12C and FIG. 14C are schematic sectional views of the ceramic of the present invention having a material with different dielectric constant filled in the concavities.

DETAILED DESCRIPTION OF THE PREFERRED EMBODIMENTS

Examples of the functional portions which can be possessed by the ceramic of the present invention may include, for example, electronic part constituting units such as capacitors, resistors, insulators, diodes, transistors, etc. Such functional portions can be arranged within a ceramic and can be separated from each other by interposing therebetween regions different in dielectric constant as mentioned above.

A. The first embodiment of the region different in dielectric constant as mentioned above constituting the ceramic of the present invention is one due to the difference in composition or structure of the constituting material. Herein, the difference in composition or structure includes not only the case where the chemical composition itself is different but also the case where the grain structure or the microstructure (e.g. crystalline structure or amorphous network, etc.) is modified, with or without a change in chemical composition, due to e.g. the difference in treatment steps up to formation of the ceramic, even if the starting material composition may be identical.

In the following, as a typical example of the ceramic of the present invention, dielectric porcelains are to be described in detail.

Dielectric porcelains are generally obtained according to the method that sintered products are obtained by molding and calcination of at least one of dielectric components such as $BaTiO_3$, $SrTiO_3$, $MgTiO_3$, $(Ba,Sr)(Ti,Sn)O_3$, type compound oxides (including solid solutions), $(Ba,Sr)TiO_3$ type compound oxides (including solid solutions), $(Mg,Sr,Ca)TiO_3$ type compound oxides (including solid solutions), $(Sr,Pb)TiO_3$ type compound oxides (including solid solutions), $(Sr,Ca)TiO_3$ type compound oxides (including solid solutions) $Fe_3$, $ZnO$, $Si_3H_4$, etc., or according to the method that oxides of La, Dy, Nd, Y, Nb, Ta, Er, Gd, Ho, Ce, etc., are additionally mixed with the above dielectric components as components necessary for converting them into semiconductors, then molded to obtain a green compact and subjected to primary calcination to be converted into semiconductors, followed by secondary calcination with a metal or metal oxide (e.g. Cu, Bi, CuO, $MnO_2$, $Ti_2O_3$, PbO, $P_2O_5$, $Bi_2O_3$, $Nb_2O$, ZnO, etc.) coated on the surface of the primarily calcined product to form grain boundary insulating layers.

The dielectric porcelain as the ceramic of the present invention may be constituted of, for example, a sintered product directly obtained from the above dielectric components without the step of conversion to a semiconductor as mentioned above or alternatively of a dielectric porcelain obtained through the step of conversion into a semiconductor. Also, it may be constituted of a mixed system of these types of methods of producing a ceramic.

Figure 1:
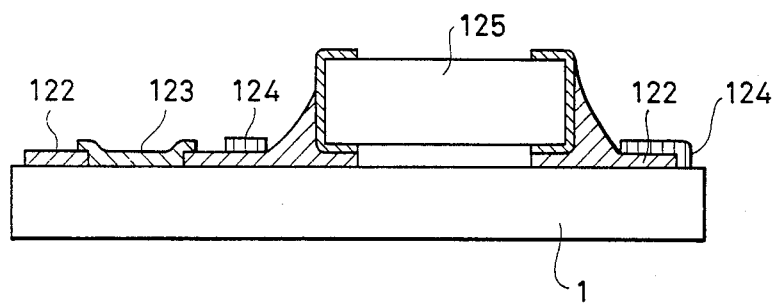
FIG. 1 and FIG. 2 are schematic sectional views showing the constitutions of electronic circuit substrates of the prior art.
Figure 2:
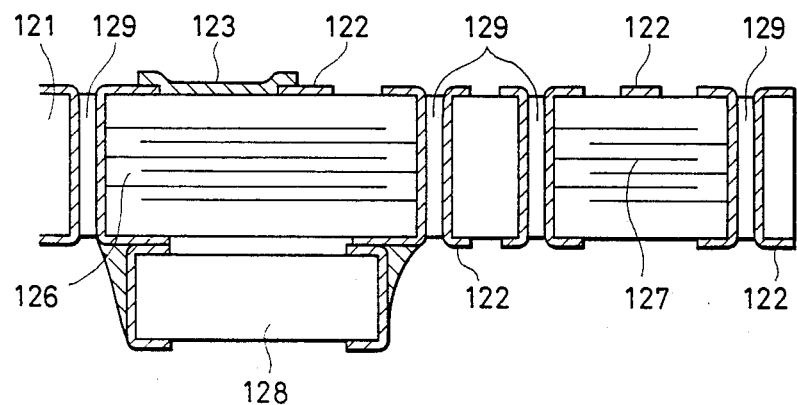
Figure 3:
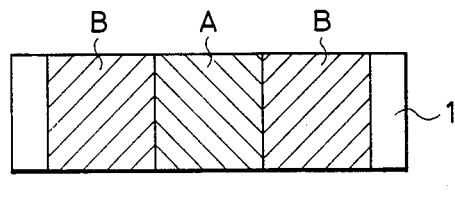
FIG. 3 through FIG. 5 are each schematic sectional views of the ceramic according to the present invention.
Figure 4:
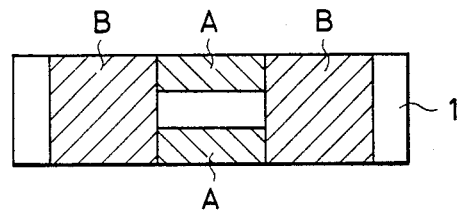
Figure 5:
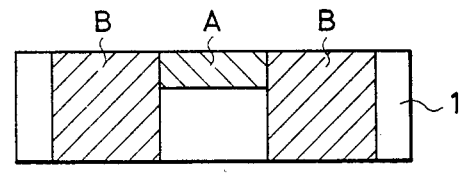

As an illustration for a plate-shaped dielectric porcelain, examples of the shapes of regions substituted with materials having a different dielectric constant as above and of functional portions are shown in FIGS. 3 to 5. In FIGS. 3 to 5, numeral 1 relates to a plate-shaped dielectric porcelain, A is a region composed of a material having a different dielectric constant and B is a functional portion.

In FIG. 3, there are provided an A region having a rectangular cross-section reaching both main faces of the plate-shaped dielectric porcelain 1, and two functional B portions separated from each other by the A region sandwiched therebetween.

In FIG. 4, there are provided two A regions each having a rectangular cross-section at the respective surface layer portions of both the main faces of the porcelain 1, and two functional B portions separated from each other by the A regions sandwiched therebetween.

In FIG. 5, there are provided an A region having a rectangular cross-section at the surface layer portion of one of the main faces of the porcelain 1, and two functional B portions separated from each other by the region A sandwiched therebetween.

In FIGS. 3–5, one or two A regions formed by substitution with a material having a different dielectric constant are provided, but the present invention is not limited to these embodiments and it is possible to determine the number of A regions corresponding to the desired number of functional portions, and three or more of A regions can be provided, as a matter of course. Also, as described above, the porcelain 1 may be constituted of a sintered product directly obtained from the above dielectric components without the step of conversion into semiconductor, or alternatively it may be also constituted by, for example, substituting at least one of A and B regions with a dielectric porcelain obtained after the step of conversion into a semiconductor.

The above-mentioned functional B portion can be constituted of, for example, a high dielectric material and, in this case, the functional B portions can be sufficiently separated by constituting A of a material having a lower dielectric constant than the B region.

As a method for providing the region replaced with a material having a different dielectric constant as mentioned above, there may be employed, for example, the following method.

(i) The method of forming a region with a different dielectric constant by providing a vacant space in a molded product containing a dielectric or a precursor thereof, packing a material with a different dielectric constant into said vacant space and subjecting the product, if necessary, to the step of calcination, etc.

The aforesaid molded product refers to, for example, a green compact (a solid of pressed powder of, for example, metal oxides used as a starting material), a burned or sintered product such as porcelains, etc., containing a dielectric or a precursor of a dielectric (e.g. a solid comprising semiconductor porcelain or semiconductor particles obtained by primary calcination during synthesis of the solid shaped in pressed powder as mentioned above or high dielectric constant material of the grain boundary insulation type).

The specific feature of this method resides in providing a single or a plurality of vacant spaces in the above molded product, filling the vacant spaces with a material having a different dielectric constant and optionally subjecting the molded product to steps such as calcination, etc., to form a product having a different dielectric constant. Accordingly, by providing a single or a plurality of vacant spaces in a molded product and filling them with, for example, a material having a lower dielectric constant, two or more portions to be made higher in dielectric constant around the vacant space can be separated, whereby two or more high dielectric material portions separated from each other can be formed. The vacant space as herein mentioned may be a concavity or a groove provided at the surface layer portion of the above molded product, or alternatively it may be a thru hole bored through the molded product having respective openings at the different surface layer portions of the molded product.

As an example, a porcelain substrate constituted of a high dielectric material of the grain boundary insulation type can be generally obtained by, for example, adding oxides of La, Dy, Nd, Y, Nb, Ta, Er, Gd, Ho, Ce, etc., as components necessary for conversion into a semiconductor, to dielectric material components such as $BaTiO_3$, $SrTiO_3$, $MgTiO_3$, $(Ba,Sr)(Ti,Sn)O_3$ type compound oxides (including solid solutions), $(Ba,Sr)TiO_3$ type compound oxides (including solid solutions), $(Mg,Sr,Ca)TiO_3$ type compound oxides (including solid solutions), $(Sr,Pb)TiO_3$ type compound oxides (including solid solutions), $(Sr,Ca)TiO_3$ type compound oxides (including solid solutions), $Fe_2O_3$, $ZnO$, $Si_3N_4$, etc. to be mixed therewith, forming the mixture into a molded product in shape of pressed powder, converting the molded product into a semiconductor by primary calcination, subsequently applying a metal or a metal oxide (e.g. Cu, Bi, $CuO$, $MnO_2$, $Tl_2O_3$, PbO, $P_2O_5$, $Bi_2O_3$, $Nb_2O$, ZnO, etc.) on the surface of the calcined product, followed by secondary calcination to form grain boundary insulating layers. When practicing the present invention in this example, at first a vacant space with desired shape is provided at the desired site: in the above molded product shaped in pressed powder, the calcined product after primary calcination, the calcined product coated on the surface with a metal or a metal oxide or the calcined product after the secondary calcination. The number of the vacant spaces can be determined suitably depending on the number of the dielectric portions to be formed as sectionalized. As the method for providing concavities or grooves to be provided at the surface layer portions, there may be employed, for example, press molding, laser working, mechanical working (e.g. diamond cutting), sonication working, etc., of the pressed powder.

The method for providing communicating holes includes the following methods.

Molded product before primary calcination

Molding by use of a core;
Punching; and
Laser working.

Molded product after primary calcination (semiconductor porcelain)

Sand blast;
Sonication working;
Discharging working;
Cutting working (diamond tool); and
Etching (lead resist, hydrofluoric acid treatment).

Molded product after secondary calcination (dielectric material porcelain)

Sand blast;
Laser working;
Sonication working;
Cutting working; and
Etching.

Subsequently, the communicating holes thus provided are filled with, for example, a material with low dielectric constant and thereafter the molded product is subjected to the steps for obtaining the porcelain substrate, or after passing through the third calcination which may be optionally conducted, to obtain a porcelain substrate having high dielectric material portions separately formed in a plural number. The high dielectric material portions formed by sectionalization may have dielectric constants which may be either identical or different. As the method for making different the dielectric constants, there may be employed, for example, a method in which the kinds of the coating additives are varied. As the above low dielectric constant material to be used for obtaining the porcelain substrate according to this example, those having a lower melting point than the main porcelain are still preferred, for example, $PbSiO_3$, $BSiO_3$, $LiSiO_{3H}$, and various crystallized glasses can be preferably used.

Alternatively, the dielectric constant can be made different by selecting the powder in which the kinds or the amounts of the dielectric material components or the components necessary for conversion into semiconductors are appropriately altered as the material to be filled in the vacant space (ii) The method of obtaining a molded product by filling two or more kinds of ceramic forming grain groups capable of forming materials with different dielectric constants as sectionalized from each other.

The above-mentioned ceramic forming grain group means, for example, the group of particles of metal oxides, etc., capable of forming a dielectric material, the group of particles of a dielectric material itself, the group of semiconductor particles for forming a high dielectric material of the grain boundary insulating type as mentioned above or a mixture of these. As a method for filling two or more kinds of ceramic forming grain groups as sectionalized from each other, for example, the mold to be used in normal temperature compression molding is sectionalized with a partitioning material comprising a substance which can be volatilized through decomposition or evaporation by heating according to calcination such as organic resins, the respective sections are filled with different kinds of ceramic forming grain groups respectively and thereafter the partitioning material is volatilized by heating in subsequent calcination, etc. Alternatively, a material which can be easily removed after filling different kinds of substances within the mold can be used as the above-discussed partitioning material. In this case the different kinds of substances are filled in the mold and subjected to compression molding after removing the partitioning material.

The specific feature of this method resides in the use of a calcined product having two or more semiconductor portions that are separated from each other. The calcined product is formed by sectionalization by use of a molded product obtained by filling two or more kinds of different ceramic forming grain groups as sectionalized from each other in the case of, for example, a grain boundary insulation type ceramic. Also the respective semiconductor portions, after obtaining the calcined product can be converted to dielectric materials to form, by sectionalization, two or more dielectric materials with different dielectric constants within the calcined product.

Thus, the ceramic obtained according to the present invention can be formed by sectionalization under the state wherein the dielectric materials are sufficiently separated as the functional portions. Therefore, for example, for dielectric material porcelain obtained by converting a semiconductor porcelain into dielectric material, by forming a plural number of high dielectric portions separated from each other within a ceramic, a ceramic capacitor or a capacitor built-in substrate equipped with a plural number of capacitor functional portions can be made. Also, including these, the ceramic utilizable for electronic materials obtained by the present invention can be formed by sectionalization under a state wherein the functional portions utilizing semiconductor can be sufficiently separated. Therefore, for example, it is also possible to have a conductor portion (conductive portion) formed by utilization of semiconductor, a variator device, etc., built in the substrate and it also becomes possible to prepare a device equipped with a plural number of semiconductor device functional portions.

The above ceramic forming grain group to be used in the present invention refers to, for example, the group of particles of metal oxides containing components necessary for conversion into semiconductors. Two or more kinds of different ceramic forming grain groups constituting the molded product according to the present invention refer to two or more kinds of groups of particles selected from among different kinds of ceramic forming grain groups with different compositions, and they can be selected appropriately so as to comply with the desired characteristics depending on the use of the ceramic utilizable or electronic materials produced according to the method of the present invention.

As an example, the porcelain substrate constituted of a high dielectric material of the grain boundary insulation type can be obtained, as described above, generally by adding oxides of La, Dy, Nd, Y, Nb, Ta, Er, Gd, Ho, Ce, etc., as the component necessary for conversion into semiconductors to dielectric material components such as $BaTiO_3$, $SrTiO_3$, $MgTiO_3$, $(Ba,Sr)(Ti,Sn)O_3$ type compound oxides (including solid solutions), $(Ba,Sr)TiO_3$ type compound oxides (including solid solutions), $(Mg,Sr,Ca)TiO_3$ type compound oxides (including solid solutions), $(Sr,Pb)TiO_3$ type compound oxides (including solid solutions), $(SrCa)TiO_3$, type compound oxides (including solid solutions), $Fe_2O_3$, ZnO, $Si_3N_4$, etc., to be mixed therewith, then forming the mixture into a molded product in shape of pressed powder, converting the molded product into semiconductor by primary calcination, subsequently coating the surface of the calcined product with a metal or a metal oxide (e.g. Cu, Bi, CuO, $MnO_2$, $Tl_2O_3$, PbO, $P_2O_5$, $Bi_2O_3$, $Nb_2O$, ZnO, etc.), followed be secondary calcination to form grain boundary insulating layers. When practicing the present invention in this example, for example, the above molded product in the shape of pressed powder is constituted by filling two or more kinds of different ceramic forming grain groups as sectionalized from each other.

Figure 6:
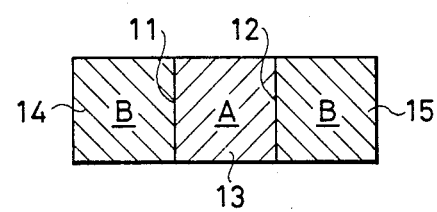
FIGS. 6 through 8 are each schematic sectional views showing the sectionalized state of different-semiconductor-forming grain groups.
Figure 7:
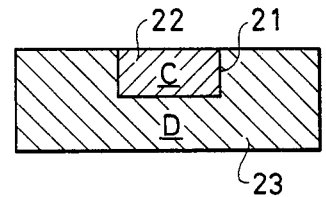
Figure 8:
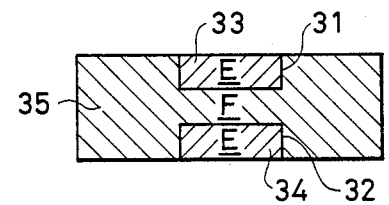

For example, in the case of a plate-shaped molded product for forming a porcelain substrate, examples of the sectionalized state of the different kinds of ceramic forming grain groups include those as shown in FIGS. 6 to 8.

In the example shown in FIG. 6, by the use of two kinds of different ceramic forming grain groups A and B two planar partitions 11, 12 are provided in the direction of the thickness of the molded product with the central section 13 being filled with the grain group A, and the sections 14, 15 on both sides thereof with the grain group B.

In the example shown in FIG. 7, by using similarly the grain groups C, D, a partition 21 with a U-shaped cross-section at the surface layer portion of one main face of the molded product and the section 22 with a rectangular cross-section is internally filled with the grain group C, and the remainder section 23 being internally filled with the grain group D.

In the example shown in FIG. 8, by using similarly the grain groups E, F, partitions 31, 32 with U-shaped cross sections are provided at the surface layer portions of the two respective main faces of the molded product and the sections 33, 34 with rectangular cross sections are internally filled with the grain group E and the remainder section 35 is internally filled with the grain group F.

The method for filling different kinds of ceramic forming grain groups as sectionalized from each other, for example, comprises the steps of: internally sectionalizing a mold to be used in normal temperature compression molding with a partitioning material comprising a substance capable of being volatilized through decomposition or evaporation by heating in calcination such as organic resins, internally filling the respective sections with the respective desired different ceramic forming grain groups and thereafter volatilizing the partitioning material by heating such as calcination. Alternatively, by using a material which can be easily dismantled after filling of different substances within a mold as the above partitioning material, different substances are filled and pressure molding is carried out with the partitioning material being dismantled.

In FIG. 6 to FIG. 8, examples are shown when two kinds of gratn groups are filled in 2 or 3 sections, but the number of the sections as well as the number of the kinds of grain groups are not limited to these examples.

For example, in the examples shown in FIG. 6 to FIG. 8, by making the grain groups B, D, F the ceramic forming grain groups for providing high dielectric materials and the groups A, C, E ceramic forming grain groups for providing low dielectric materials, two high dielectric material portions separated by the low dielectric material portions 13, 22, 33, 34 can be formed.

Thus, by increasing the number of the sections within the molded product, the dielectric material portions can be increased to a desired number.

In the case of forming, for example, a dielectric porcelain according to the method of the present invention, two or more kinds of different ceramic forming grain groups can be constituted by altering suitably the kinds and amounts of the components necessary for the dielectric material components as described above and for conversion to semiconductors. Alternatively, it is also possible to use the grain groups of substance which can be made of low dielectric materials such as $PbSiO_3$, $BSiO_3$, $LiSiO_3$, various crystallized glasses, etc., in combination with the grain groups which can be made of high dielectric materials by use of the dielectric material components such as $BaTiO_3$, etc., as mentioned above.

In the case of constituting a dielectric porcelain, the molded product thus constituted is then subjected to the subsequent steps for obtaining a porcelain substrate to obtain, for example, a porcelain substrate having a plural number of high dielectric material portions formed by sectionalization. The dielectric constants at the high dielectric material portion formed by sectionalization may be the same or different from each other (iii) The method of constituting regions with different dielectric constants by forming a diffusion layer from a different diffusion source for formation of electronic parts internally of a dielectric material porcelain.

The specific feature of this method resides in forming a diffusion layer with a low dielectric constant internally of a porcelain by forming a layer of for example $MgTiO_3$, $SiO_2$, $Al_2O_3$, etc., as the diffusion source which can be made to have a low dielectric constant at the surface layer portion of the dielectric porcelain obtained by secondary calcination, thereby separating two or more high dielectric material portions through the portions having the diffusion layer with low dielectric constant. In this case, the portion having the diffusion layer with low dielectric constant may be formed only at the surface layer portion of the dielectric porcelain, or alternatively it may be formed in a different surface layer portion of the dielectric porcelain. Also, when forming a coating layer of a metal or a metal oxide on the surface of a semiconductor porcelain and forming a dielectric porcelain having high dielectric constant by secondary calcination, the aforesaid layer of the diffusion source for lowering the dielectric constant may be formed on a part of the coated layer of the above metal or metal oxide, whereby two or more high dielectric material portions can be separated through the low dielectric material portion.

In these examples, the diffusion source employed may be varied suitably and the number of the condenser constituent units formed is not particularly limited.

(iv) The method of constituting regions with different dielectric constants by partial melting of a molded product containing a dielectric material or a precursor thereof.

The above molded product refers to the same molded product as explained in the above item (i). The specific feature of this method resides in having a portion with a different dielectric constant formed by applying partial melting to the above molded product. The portion with a different dielectric constant may be provided at the surface layer portion of the above molded product or alternatively as communicated to the different surface layer portion of the above molded product. Accordingly, by forming a single or plural partially melted portions, and lowering the dielectric constant of each of these portions from, for example, the peripheral portion thereof, the portions to be made highly dielectric can be separated into two or more portions with each of these melted portions sandwiched therebetween thereby forming two or more high dielectric material portions separated from each other by sectionalization.

As an example, a porcelain substrate constituted of a grain boundary insulation type high dielectric material can be obtained as described above, generally by converting a molded product in the form of a pressed powder comprising a mixture of $BaTiO_3$, etc., admixed with components such as $Dy_2O_3$, $SiO_2$, etc., to a semiconductor by primary calcination, subsequently coating the surface of the calcined product with a metal or a metal oxide (e.g. Cu, CuO, $MnO_2$, $Tl_3O_3$, etc.), followed by secondary calcination to form a grain boundary insulating layer.

In the case of practicing the present invention in this example, partial melting is applied in a desired shape at the desired site in the above molded product in the form of a pressed powder to the calcined product after primary calcination, the calcined product coated on the surface with the metal or a metal oxide or the calcined product after secondary calcination. The number of the portions to be subjected to partial melting may be determined suitably depending on the number of the dielectric members to be formed by sectionalization. As the method for partial melting, for example, the method by means of laser ($CO_2$, laser, YAG laser, etc.) irradiation, electron beam irradiation, etc., is excellent.

Next, after partial melting is thus applied, following subsequent steps for obtaining a porcelain substrate, a porcelain substrate having formed a plurality of high dielectric material portions by sectionalization is obtained. The dielectric constants of the high dielectric material portions formed by sectionalization may be either the same or different from each other. As the method for making the dielectric constants different, for example, there may be employed the method in which the kinds of the additives coated are varied, etc.

B. As the second method for providing a region replaced with a material having a different dielectric constant, there is, for example, a method in which in calcining the molded product by practicing the method for producing the ceramic of the present invention, a portion having a different dielectric constant is formed by promoting or inhibiting compulsorily the grain growth by calcination at the surface layer portion or internally of the molded product. By doing so, two or more high dielectric material portions can be formed internally within one ceramic by providing the portions separated from each other with a portion lower in dielectric constant by inhibition of grain growth sandwiched therebetween.

The above molded product is inclusive of, for example, the green compact (a solid in the form of a pressed powder such as metal oxides for starting materials), a calcined product or sintered product (porcelain, etc.), including dielectric materials or precursors for forming dielectric materials (e.g. solids in the form of a pressed powder as mentioned above, solids comprising semiconductor porcelains or semiconductor grain groups obtained by primary calcination in synthesizing grain boundary insulation type high dielectric material).

For example, by referring to the dielectric porcelain obtained after conversion into semiconductors as mentioned above, typical examples of the present invention will now be discussed.

(i) During preparation of pressed powder

Press molding is performed by filling of a starting material sufficiently added with, for example, $SiO_2$, having the effect of promoting grain growth at the portion where a high dielectric constant is desired, while with filling of a starting material having a smaller $SiO_2$, content contributing to grain growth at the other portion, namely the portion where a low dielectric constant is desired. The above press molded product is subjected to primary calcination to be converted to a semiconductor, and subjected to secondary calcination after application of an additive to effect grain boundary insulation. In such a porcelain, grain growth occurs sufficiently at the portion where $SiO_2$ is added in a sufficient quantity to make that portion highly dieletric, while grain growth at the portion of decreased $SiO_2$ content occurs less well to make that portion have a low dielectric constant.

Following subsequently the steps for obtaining a porcelain substrate including calcination, a porcelain substrate having a plural number of high dielectric material portions is formed by sectionalization. The dielectric constants of the high dielectric material portions formed by sectionalization may be either the same or different from each other.

In the case of forming a portion which is made to have a high dielectric constant by promoting grain growth or recrystallization, it is preferable to make the grain size 1.5 or 4 or more times that where the grain size is not promoted. On the other hand, in the case of forming a portion which is made to have a low dielectric constant by supressing grain growth recrystallization, it is preferable to make the grain size ⅔ or less, or ¼ or less of that at the portion where no such inhibition is effected.

Also, in the method of the present invention, as described above, regions with different dielectric constants can be formed depending on the difference in the sizes of the constituent grains, and at the same time the dielectric constants can be made different by changing the composition or structure of the constituent material in this region or in other portions.

As the specific methods for making the dielectric constants different by changing the composition or structure of the constituent materials, there may be employed the methods (i)-(iv) as described above.

C. As the third method for providing a region replaced with a material with different dielectric constant as mentioned above, there is, for example, a method in which in calcining the molded product by practicing the method for preparation of ceramic of the present invention, a portion of the dielectric material forming grain group is formed at the surface layer portion or internally of the above molded product by molding with a portion of a dielectric material forming grain group of a changed density by, for example, an increase or decrease of the binder content, and then the molded product is calcined.

There is also the method in which calcining is performed with a material capable of absorbing the components of the molded product contacted on the surface of the above molded product.

By ensuring that the portions separated from each other are provided with a portion lower in dielectric constant by the reduction in density, that is sandwiched therebetween, two or more high dielectric material portions can be formed internally within one ceramic.

The above molded product is inclusive of, for example, the green compact (a solid in the form of a pressed powder such as metal oxides for starting materials), a calcined product or sintered product (porcelain, etc.), including also dielectric materials or precursors for forming dielectric materials (e.g. solids in the form of a pressed powder as mentioned above, solids comprising semiconductor porcelains or semiconductor grain groups obtained by primary calcination in synthesizing a grain boundary insulation type high dielectric material).

The particles of the above dielectric material or precursor for forming dielectric material include, for example, the particles of the above metal oxides, calcined product particles, sintered product particles, semiconductor particles and dielectric material particles.

In the case of forming a portion increased in dielectric constant by an increase of the density, the density should preferably be made 1.1 or 1.3 times or higher than that of the portion where the density is not increased. On the other hand, in the case of forming a portion lower in dielectric constant by a decrease in density, the density should be 10/11, 10/13, or lower than that at the portion where the density is not decreased.

The material for absorbing the components of the above molded product to be used in the present invention refers to a material capable of absorbing the components of the molded product by permitting primarily the main components of the molded product through thermal diffusion to contact the molded surface during calcination. As specific examples, it is necessary to choose a material which can generate a liquid phase, etc., at a relatively low temperature (lower than the sintering temperature of the components of the molded product) and which material itself can be thermally diffused into the molded product with difficulty or will not produce deleterious effects on the components of the molded product even if thermally diffused.

For example, there may be employed $SiO_2$, $Al_2O_3$, mixtures of $SiO_2$ and $Al_2O_3$, MgO, etc. The material capable of absorbing the components of the molded product may be brought into contact with the molded product in the form of a paste, in the form of a molded product such as plate, sheet, etc., or in the form of powder. The step of absorbing the components of the molded product may advantageously be carried out during primary calcination, secondary calcination or during the tertiary calcination after completion of the forming of the dielectric material porcelain.

As to the conditions of atmosphere and temperature during calcination, there is no particular limitation except that it is desirable to maintain the temperature and atmosphere so that the characteristics at the portion not in contact with the material absorbing the components of the molded product do not deteriorate. For example, it is desirable to maintain the temperature at lower than the calcination temperature of the components of the molded product, particularly the main components of the molded product.

Also, in the method of the present invention, as described above, the dielectric constants can be made different by forming the regions with different densities of the constituent materials and at the same time varying the composition or microstructure of the constituent materials in this region or other portions or the sizes of the constituent particles.

As the specific methods for making dielectric constants different by varying the composition or structure of the constituent materials, there may be employed the methods as described in the above (i)-(iv) and the above item B.

When constituting an electronic circuit substrate by use of the ceramic of the present invention thus obtained, by providing, for example, conductor portions (electrodes, lead-out portions, etc.) on the surfaces of the respective high dielectric material portions, a plural number of capacitors can be built in. Further, by forming a conductor portion, resistor or insulator portion (which can be formed by, for example, conventional thin film or thick film forming method) internally or around the ceramic, an electronic circuit substrate equipped with many functional portions can be produced.

The present invention is described in more detail by referring to the following examples, by which the embodiments of the present invention are not limited.

EXAMPLE 1

Figure 9:
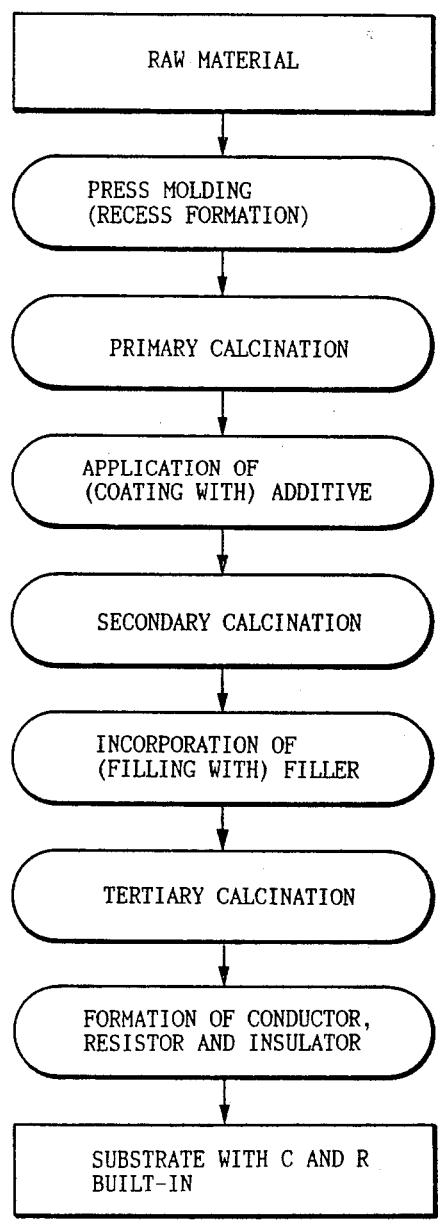
Figure 10A:
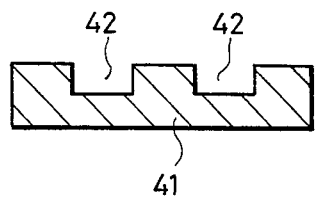
FIG. 10A is a schematic sectional view of a molded product having a concavity and FIG. 10B is a schematic sectional view of the ceramic of the present invention having a material with different dielectric constant filled in the concavity.
Figure 10B:
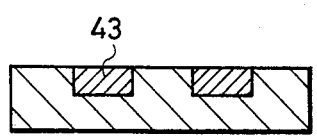

FIG. 9 shows the steps for preparation of the ceramic which is an example of the present invention. In this example, as shown in FIG. 10A, concavities 42 are formed in the molded product 41 during press molding. Next, following the same steps as in preparation of a conventional ceramic capacitor, a $BaTiO_3$-$Dy_2O_3$-$SiO_2$ type dielectric porcelain is formed. More specifically, a molded product is subjected to primary calcination in a predetermined atmosphere, then applied with a coating of additives such as CuO, etc., and subjected to secondary calcination in an oxidative atmosphere to produce a dielectric porcelain substrate. After the concavities of the above dielectric porcelain substrate are filled with, for example, PbSiO₃ powder 43 as shown in FIG. 10B, the third calcination is conducted. Further, by forming a predetermined conductor portion, resistor portion and insulating portion on the porcelain substrate, a substrate having a capacitor C and an electric resistance R built therein is obtained.

EXAMPLE 2

Figure 11:
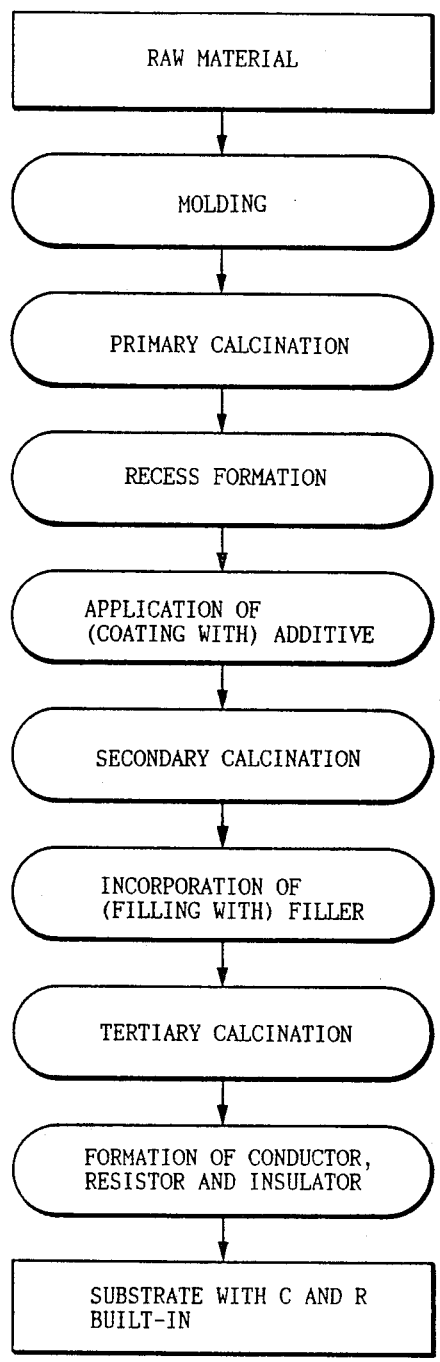
Figure 12A:
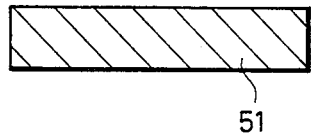
Figure 12B:
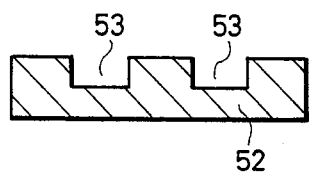
Figure 12C:
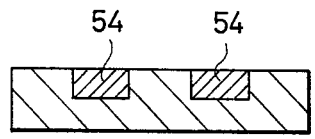

FIG. 11 shows other steps for the preparation of the ceramic which is an example of the present invention. In this example, a molded product 51 with a desired shape is obtained by molding (FIG. 12A), and concavities 53 are formed by laser irradiation in the porcelain substrate 52 converted to a semiconductor by primary calcination (FIG. 12B). Next, additives are applied, followed by secondary calcination to obtain a dielectric porcelain substrate. The cavities of the above porcelain substrate filled with, for example, PbSiO₃ powder 54 as shown in FIG. 12C. Then, the third calcination is conducted. Further, by forming a predetermined conductor portion, resistor portion and insulating portion on this substrate, a substrate having capacitor C and electric resistance R built therein is obtained.

EXAMPLE 3

FIG. 13 shows other stees for the preparation of the ceramic which is an example of the present invention. In this example, a molded product 61 with a desired shape is obtained by molding (FIG. 14A), and after application of additives on the porcelain substrate converted to a semiconductor by primary calcination, secondary calcination is conducted to obtain a dielectric porcelain substrate 62. In the porcelain substrate, concavities 63 are formed according to mechanical working by use of a diamond tool (FIG. 14B), and its concavities are filled with, for example, PbSiO₃ powder 64 as shown in FIG. 14C. Then, the third calcination is conducted. By forming a predetermined conductor portion, resistor portion and insulating portion on the above substrate, a substrate having capacitor C and electric resistance R built therein is obtained.

Figure 15A:
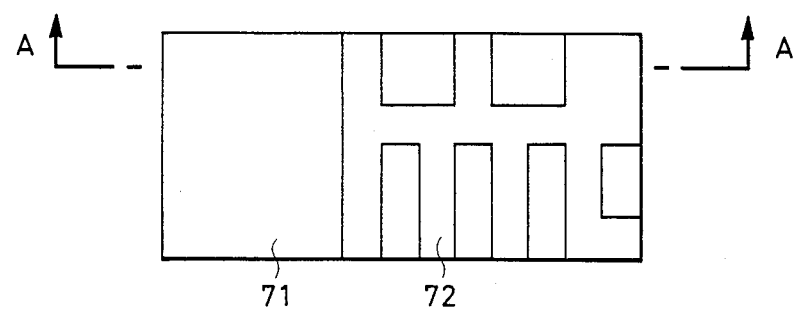
FIGS. 15A, 24A, 31A, 44A, and 48A are each schematic plan views of the ceramic of the present invention.
Figure 15B:
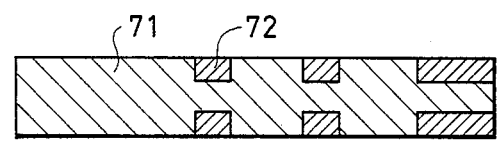
FIGS. 15B, 24B, 31B, 44B and 48B are each schematic sectional views of the ceramic of the present invention.
Figure 15C:
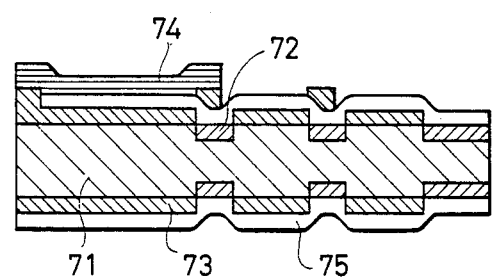
FIGS. 15C, 24C, 31C, 44C and 48C are each schematic sectional views of the electronic circuit substrate of the present invention having functional portions such as conductor, resistor, insulator, etc., formed on the above ceramic.

FIG. 15 shows an example of the ceramic of the present invention obtained by the steps as shown in the above examples. FIGS. 15A and 15B are plan view of the ceramic and the sectional view cut along A—A in FIG. 15A, 71 being the high dielectric material portion and 72 the low dielectric material portion. FIG. 15C shows an electronic circuit base in which the conductor portion 73, the resistor portion 74 and the insulating portion 75 are further formed.

EXAMPLE 4

Figure 16:
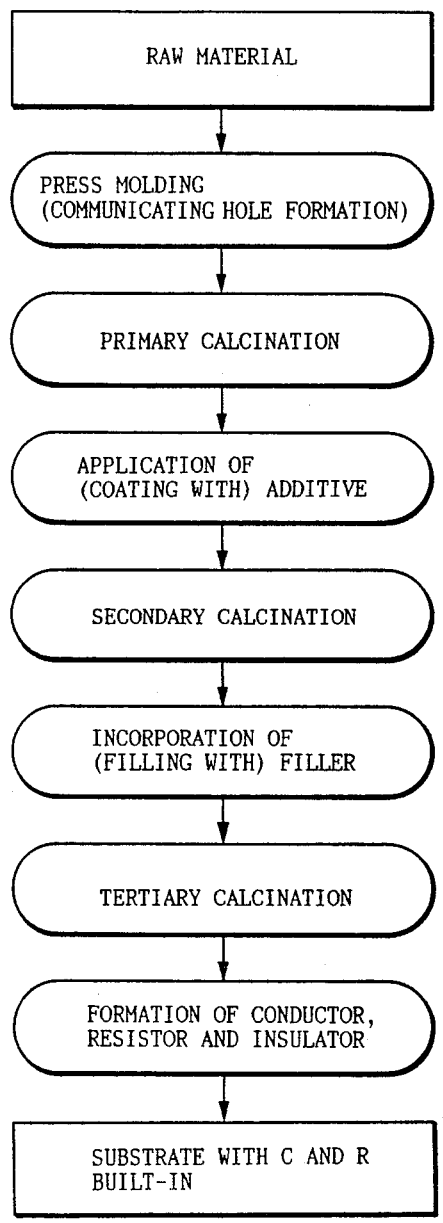
Figure 17A:
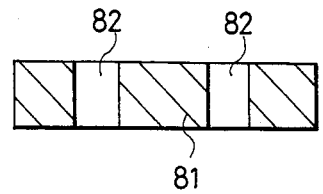
FIG. 17A and FIG. 23A are schematic sectional views of the molding having communicating holes.
Figure 17B:
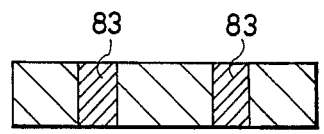
FIG. 17B and FIG. 23B are schematic sectional views of the ceramic of the present invention having a material with different dielectric constants filled in the communicating holes.

FIG. 16 shows the steps for preparation of the ceramic which is an example of the present invention. In this example, as shown in FIG. 17A communicating holes 82 are formed in the molded product 81 during press molding. Next, following the steps similar to preparation of a conventional ceramic capacitor, a BaTiO₃—Dy₂O₃—SiO₂ type dielectric porcelain is formed. More specifically, the molded product is subjected to primary calcination in a predetermined atmosphere, then applied with coating of additives such as CuO, etc., and subjected to secondary calcination in an oxidative atmosphere to obtain a dielectric porcelain substrate. After the communicating holes in the above dielectric porcelain substrate are filled with, for example, PbSiO₃ powder 83 as shown in FIG. 17B, the third calcination (900° C., 60 minutes) is conducted. Further, by forming a predetermined conductor portion, resistor portion and insulator portion on the porcelain substrate, a C, R built-in substrate is obtained.

EXAMPLE 5

Figure 18:
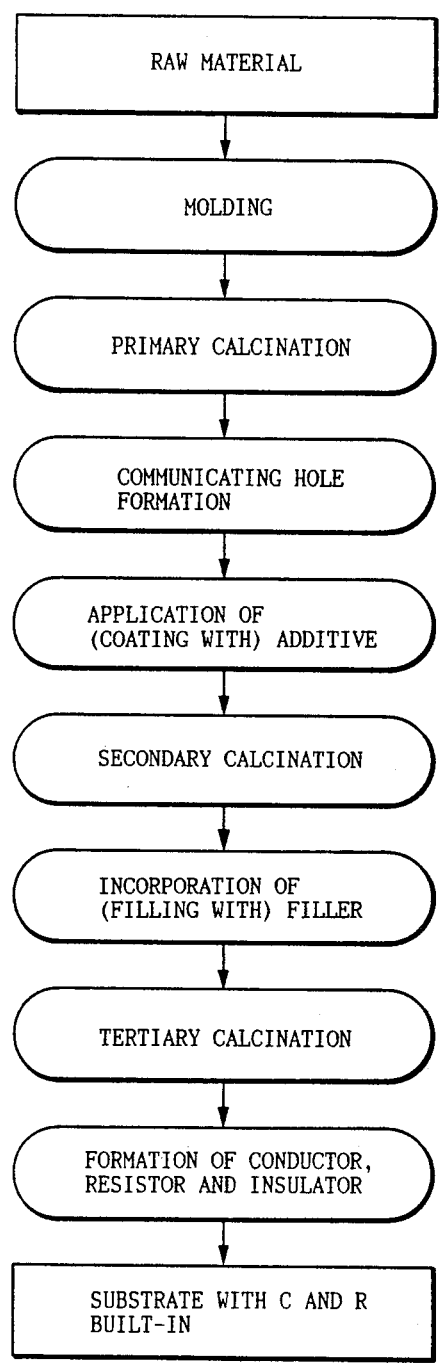
Figure 19A:
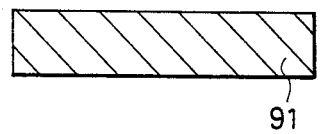
FIG. 19A and FIG. 21A are schematic sectional views of the molded product.
Figure 19B:
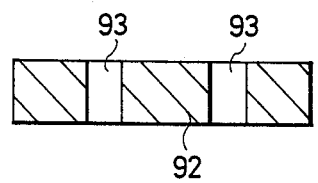
FIG. 19B and FIG. 21B are schematic sectional views of the above molded products having formed communicating holes therein and FIG. 19C and FIG. 21C are schematic sectional views of the ceramic of the present invention having a material with different dielectric constants filled in the communicating holes.
Figure 19C:
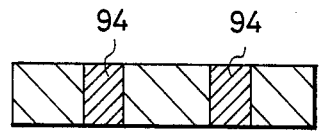

FIG. 18 shows other steps for the preparation of the ceramic which is an example of the present invention. In this example, a molded product 91 with a desired shape is obtained (FIG. 19A), and communicating holes 93 are formed by laser irradiatio in the porcelain substrate 92 converted to a semiconductor by primary calcination (FIG. 19B). Next, additives are applied, followed by secondary calcination to obtain a dielectric porcelain substrate. The communicating holes of the above porcelain substrate are filled with, for example, PbSiO₃ powder 94 as shown in FIG. 19C. Next, the third calcination is conducted. Further, by forming a predetermined conductor portion, resistor portion and insulator portion on this substrate, a C, R built-in substrate is obtained.

EXAMPLE 6

Figure 20:
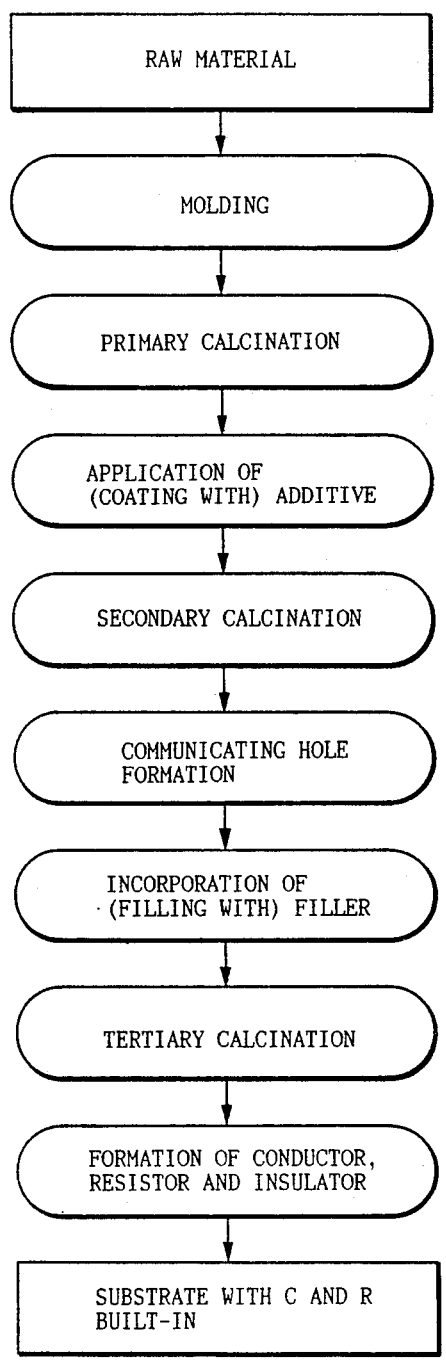
Figure 21A:
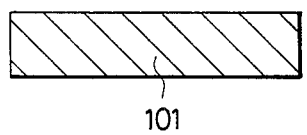
Figure 21B:
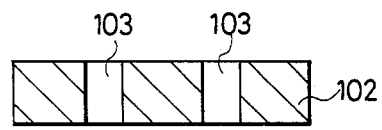
Figure 21C:
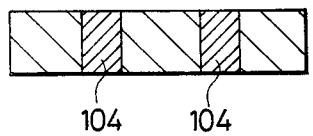

FIG. 20 shows other steps for preparation for the ceramic which is an example of the present invention. In this example, a molded product 101 with a desired shape is obtained by molding (FIG. 21A), and after application of additives onto the porcelain substrate converted to a semiconductor by primary calcination, secondary calcination is conducted to obtain a dielectric porcelain substrate 102. In the porcelain substrate, communicating holes 103 are formed according to mechanical working by use of a diamond tool (FIG. 21B), and the communicating holes are filled with, for example, PbSiO₃ powder 104 as shown in FIG. 21C. Next, the third calcination is conducted. By forming predetermined conductor portion, resistor portion and insulator portion on the above substrate, a C, R built-in substrate is obtained.

EXAMPLE 7

Figure 22:
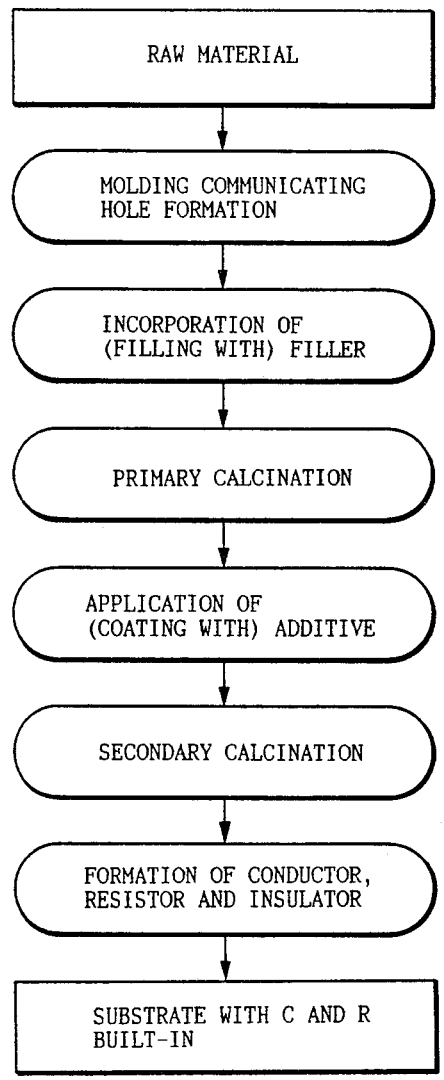
Figure 23A:
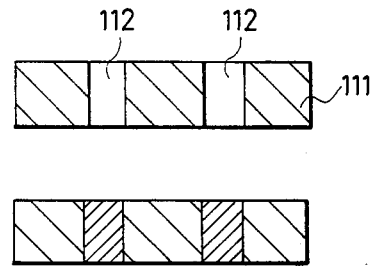
Figure 23B:

FIG. 22 shows other steps for preparation of the ceramic which is an example of the present invention. In this example, a molded product 111 having communicating holes 112, 112 is obtained by molding (FIG. 23A). The communicating holes 112, 112 can be formed by filling the starting material with cores made of a metal arranged in a mold. At the filling portion of the molded product, the same starting material as in Example 4 is filled, while the above communicating holes are filled with BaTiO₃—MgTiO₃—Dy₂O₃,—SiO₂ type [mg with the composition ratio (weight) of BaTiO₃ and MgTiO₃ being made 70:30), and then the product is converted to a semiconductor by primary calcination (1400° C., 4 hours, in gas atmosphere of N₂: H₂=95:5), and after coating of additives (MnO₂, 250 mg), secondary calcination (1300° C., 2 hours) is carried out to obtain a dielectric porcelain substrate (FIG. 23B). By forming predetermined conductor portion, resistor portion and insulator portion on the above substrate, a C, R built-in substrate is obtained. In Table 1, shown below, the respective dielectric constant $\epsilon$ values of the high dielectric material portion and the low dielectric material portion of the porcelain substrate are shown.

TABLE 1

|  | ε value |
|---|---|
| High dielectric material portion | 20,000 |
| Low dielectric material portion | 7,000 |

Figure 24A:
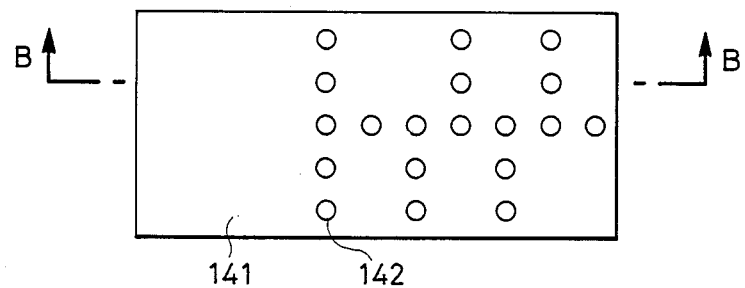
Figure 24B:
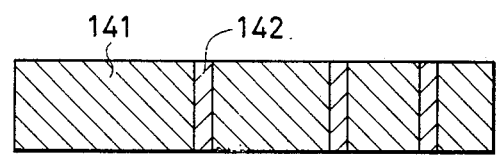
Figure 24C:
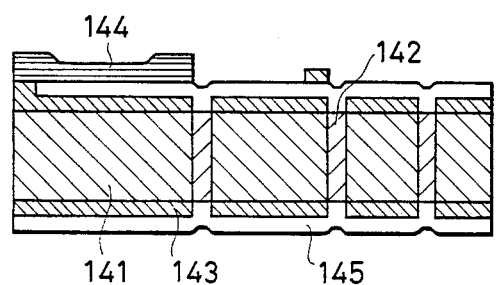

FIG. 24 shows an example of the ceramic of the present invention obtained according to the steps as shown in the above example. FIG. 24A and 24B are a plan view of the ceramic and a sectional view cut alone B—B in FIG. 24A, 141 being the high dielectric material portion and 142 being the low dielectric material portion. FIG. 24C shows an electric circuit base, in which the conductor portion 143, the resistor portion 144 and the insulator portion 145 are further formed.

EXAMPLE 8

Figure 25:
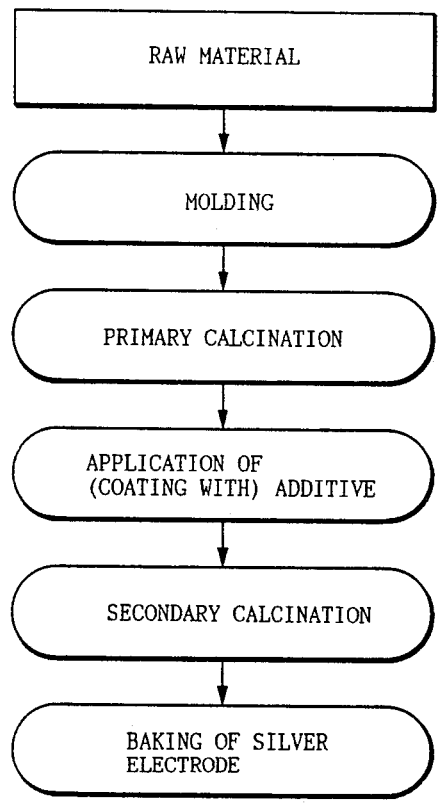
Figure 26:
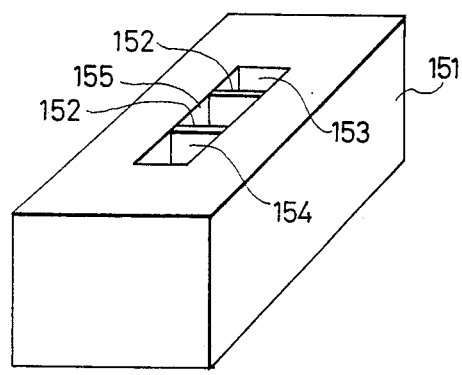
FIG. 26 is a schematic perspective view showing an example of the mold for molding in preparation of the ceramic of the present invention.

FIG. 25 shows the steps for preparation of the ceramic which is an example of the present invention. In this example, as shown in FIG. 26, the molding cavity is divided into the three sections by partitioning plates 152, 152 made of, for example, a porous polyvinyl alcohol and the void 155 at the center is filled with MgTiO$_3$—BaTiO$_3$ type semiconductor forming particles to be made of a low dielectric material and the voids 153, 154 on both sides thereof with BaTiO$_3$ type semiconductor forming particles to be made a high dielectric material, followed by pressure molding to obtain a molded product. By calcining successively the molded product following the steps shown in FIG. 25, a porcelain substrate is obtained, in which the high dielectric material portions 161, 162 comprising BaTiO$_3$ type semiconductor forming particles are separated by the low dielectric material portion 163 comprising MgTiO$_3$—BaTiO$_3$ type semiconductor forming particles. Further, with silver electrodes being baked at the respective dielectric material portions, dielectric constants are measured. The Table 2 shown below shows the respective dielectric constant ε values of the high dielectric material portion and the low dielectric material portion of the porcelain substrate.

TABLE 1

|  | ε value |
|---|---|
| High dielectric material portion | 20,000 |
| Low dielectric material portion | 7,000 |

The compositions of the semiconductor forming particles and the kinds of diffusion sources usable in this example are shown below.

| (Higher ε-value semiconductor forming particles) | |
|---|---|
| Example 1 | |
| BaTiO$_3$ | 100–90 wt. % |
| MgTiO$_3$ | 0–10 wt. % |
| Example 2 | |
| SrTiO$_3$ | 100–90 wt. % |
| MgTiO$_3$ | 0–10 wt. % |
| (Lower ε-value semiconductor forming particles) | |
| Example 1 | |
| MgTiO$_3$ | 30–100 wt % |
| SrTiO$_3$ | 70–0 wt. % |
| BaTiO$_3$ | 70–0 wt. % |
| (Diffusion source) | |

Cu, Mo, Bi, Tl, Mn or oxides of these

EXAMPLE 9

Figure 27:
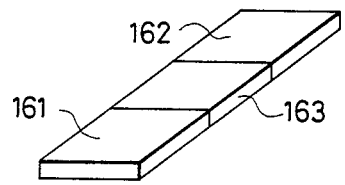
FIG. 27 is a schematic perspective view of the ceramic of the present invention by use of the mold for molding.
Figure 28:
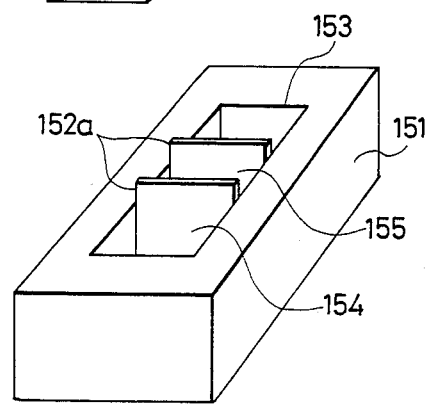
FIG. 28 is a schematic perspective view showing another example of the mold for molding in preparation of the ceramic of the present invention.

In Example 8, in place of the partitioning plates 152 of the mold cavity as shown in FIG. 26, partitioning plates 152 made of ultra-hard material, which can be dismantled easily after filling of semiconductor forming particles as shown in FIG. 28, are used, following otherwise the same procedure as Example 8 to obtain a porcelain substrate as shown in FIG. 27.

EXAMPLE 10

Figure 29A:
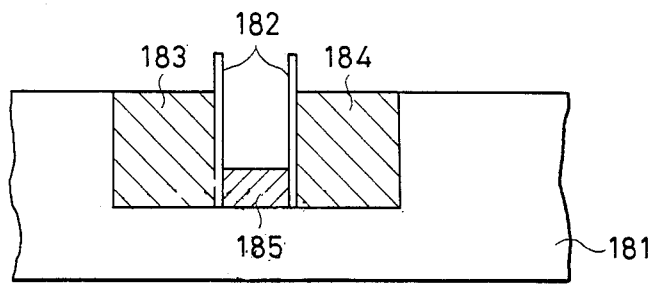
FIG. 29 is a drawing for illustration of the steps for filling materials in the mold for molding in preparation of the ceramic of the present invention.
Figure 29B:
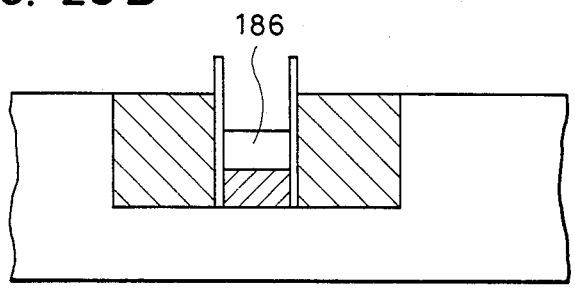
Figure 29C:
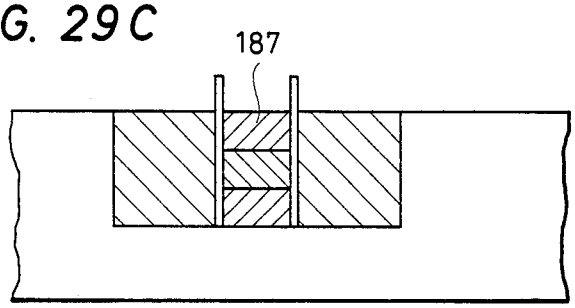
Figure 30:
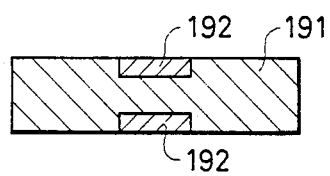
FIG. 30 is a schematic sectional view of the ceramic of the present invention prepared in the step as shown in FIG. 29.

In Example 9, filling of the semiconductor particles is conducted according to the method as shown in FIGS. 29A to 29C to obtain a porcelain substrate with a sectional structure as shown in FIG. 30.

More specifically, as shown in FIG. 29, of the three sections within the mold 181 partitioned by the partitioning plates 182 which can be removed, the sections 183, 184 are filled with predetermined amounts of the starting material for the high dielectric material and the section 185 is filled with a predetermined amount of the starting material for the low dielectric material (both being the same as Example 9, respectively). Next, as shown in FIG. 29B, the starting material 186 for the high dielectric material is filled on the layer 185 to a predetermined amount. Next, as shown in FIG. 29C, the starting material 187 for the low dielectric material is 15 filled to a predetermined amount, followed by removal of the partitioning plates. By calcining the molded product following the steps shown in FIG. 25, a calcined product as shown in FIG. 30 can be obtained. Here, 191 is a high dielectric material portion and 192 is a low dielectric material portion.

Figure 31A:
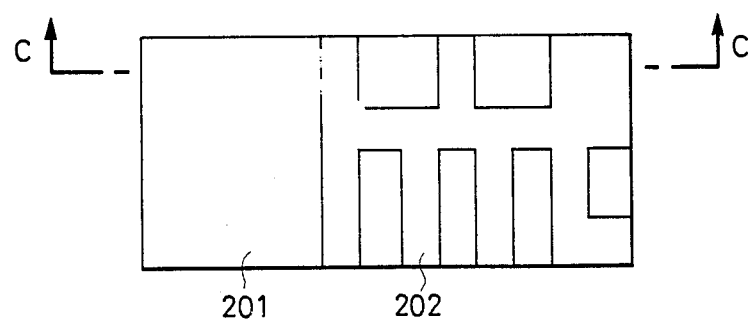
Figure 31B:
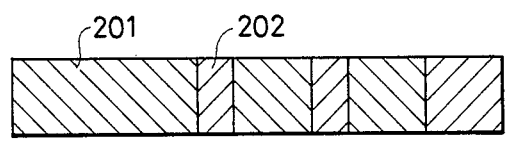
Figure 31C:
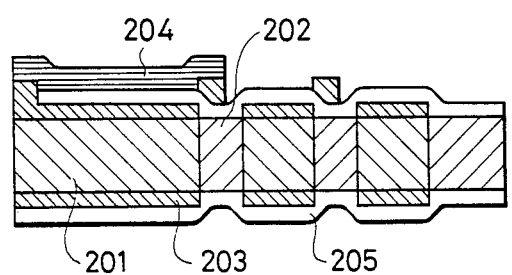

FIG. 31 shows an example of the ceramic which can be obtained according to the method as shown in the above Example 8. FIGS. 31A and 31B are a plan view and a sectional view cut along C—C in FIG. 31A of the ceramic, respectively, 201 being the high dielectric material portion and 202 being the low dielectric material portion. FIG. 31C shows an electronic circuit base in which the conductor portion 203, the resistor portion 204 and the insulator portion 205 are further formed

EXAMPLE 11

Figure 32:
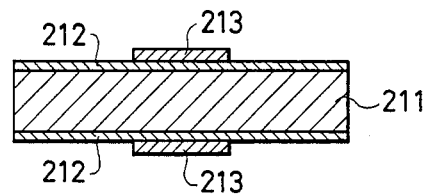
FIGS. 32, 33 and 35 are drawings for illustration of the preparation steps of one example of the present invention, FIG. 32 showing a schematic sectional view of a semiconductor porcelain substrate coated with a layer of a diffusion source, FIG. 33 showing a porcelain substrate after diffusion and FIG. 35 showing an electronic circuit substrate provided with electrodes on the surface of the porcelain substrate.

As shown in FIG. 32, on both main surfaces of the SrTiO$_3$—Dy$_2$O$_3$—SiO$_2$ type semiconductor porcelain substrate 211 formed by primary calcination, coated layers 212, 212 of a MnO$_2$ for making the substrate highly dielectric are formed, and also on a part of these coated layers a paste of MgTiO$_3$ powder for lowering the dielectric constant is printed to form coated layers 213, 213.

Figure 33:
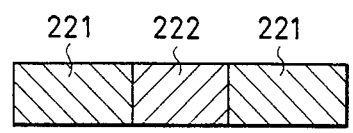
Figure 34:
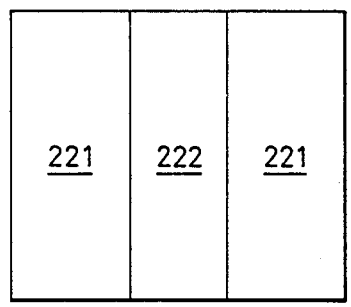
FIG. 34 is a schematic top view of the porcelain substrate in FIG. 33.

Next, the semiconductor porcelain having thus formed coated layers is calcined at 1250° C. for 2 hours to form a ceramic which can be utilized for an electronic material, having two high dielectric material portions 221, 221 and a diffusion layer 222 with a low dielectric constant (width about 1 mm) as shown in FIG. 33. FIG. 34 shows a schematic plan view of the ceramic.

Figure 35:
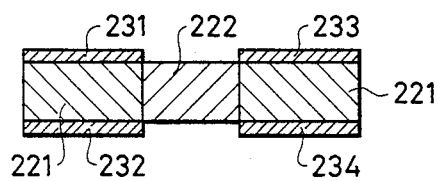

As the next step, as shown in FIG. 35, a silver paste is applied on both sides of the above high dielectric material portions 221, 221 and baked at 850° C. to form electrodes 231, 232, 233, 234, whereby a porcelain substrate having two condensers built-in is obtained.

For the electronic circuit substrate having a plural number of capacitors built therein, capacitance is measured The results are shown in Table 3.

TABLE 3

|  | Measured electrodes | Capacitance (pF) | Remarks |
|---|---|---|---|
| Example 11 | 231-232 | 44000 | Capacitor |
|  | 231-233 | 280 | Between adjacent electrodes |

From Table 3, it can be understood that in the ceramic utilizable as electronic material obtained according to the method of the present invention, two or more electronic parts constituting units can be formed so as to be sufficiently separated as the device functional portions.

EXAMPLE 12

A semiconductor substrate 211 is calcined in the same manner as in Example 11 except for providing no diffusion layer with a lowered dielectric constant.

Figure 36:
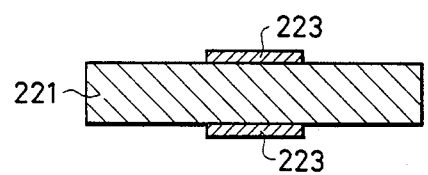
FIG. 36 and FIG. 37 are drawings for illustration of the preparation steps for another example of the present invention, FIG. 36 showing a schematic sectional view of the porcelain substrate having portions in which a diffusion layer is formed, and FIG. 37 showing an electronic circuit substrate provided with electrodes on the surface after provision of low dielectric material portions on the porcelain substrate.
Figure 37:
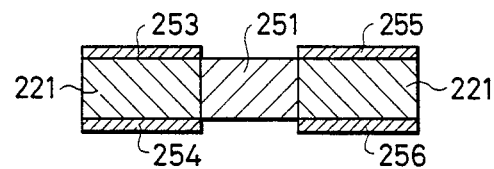

On the surface of the porcelain substrate having the uniformly high dielectric constant thus obtained, the paste 223 of lead borosilicate glass powder for lowering the dielectric constant is screen printed as shown in FIG. 36, and the heating process at 850° C. for 10 minutes is repeated four times to form a low dielectric material portion 251 as shown in FIG. 37. Next, similarly as in Example 11, silver electrodes 253, 254, and 256 are formed For the electronic circuit substrate thus obtained, capacitance is measured. The results are shown in Table 4.

TABLE 4

|  | Measured electrodes | Capacitance (pF) | Remarks |
|---|---|---|---|
| Example 12 | 253-254 | 44000 | Capacitor |
|  | 253-254 | 1000 | Between adjacent electrodes |

From Table 4, it can be understood that in the ceramic utilizable as electronic material obtained according to the method of the present invention, two or more electronic parts constituting units can be formed so as to be sufficiently separated as the device functional portions.

EXAMPLE 13

Figure 38:
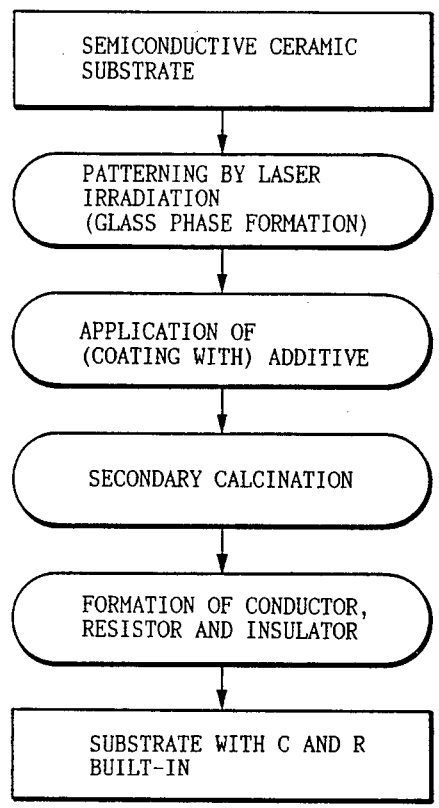
Figure 39:
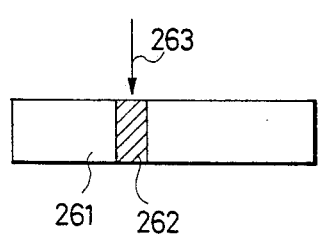
FIGS. 39, 41, 43, 45, 46, 47 and 50 are each a schematic sectional view of a porcelain applied with partial melting by laser beam irradiation.

FIG. 38 shows the steps for preparation of a porcelain substrate which is an example of the present invention. In this Example, the semiconductor porcelain substrate after primary calcination is irradiated with a laser beam as shown in FIG. 39 to thereby heat the predetermingd portion in the substrate to melt that portion once, followed by cooling. In FIG. 39, 261 shows the original crystalline semiconductor porcelain portion, and 262 the portion once melted by irradiation of laser 263. Next, the porcelain substrate has applied thereto a metal or an oxide thereof and secondary calcination is conducted. The porcelain substrate obtained from the above steps has a low dielectric constant at the portion once melted by laser irradiation and a high dielectric constant at the laser non-irradiated portion, whereby it becomes possible to obtain a porcelain substrate in which a low dielectric material portion and a high dielectric material portion exist mixed in one sheet of substrate.

Thus, in the case of effecting laser irradiation on the semiconductor porcelain, the semiconductor porcelain is once melted by laser irradiation to destroy the initial crystalline structure, whereby a product made in a glass phase or similar to glass is formed. In this Example, crystal grains with initial sizes of about 20 ξ are found to be changed rectangular structures with sizes of about 5μ similar to glass. When additives are applied on this and secondary calcination is performed, recrystallization occurs but the crystals are different from those at the laser non-irradiated portion to produce low dielectric material portions. In this Example, crystals and columnar crystals with sizes of about 8μ slightly smaller than the initial crystal are found to be formed.

Table 5 shows the dielectric constants of the inner portion of the porcelain substrate according to this Example. The laser employed here is carbon dioxide laser. Also, in this Example, a sample of 20×35, t=0.7 is used as the porcelain substrate. Measurement is conducted at a normal temperature at 1 kHz.

TABLE 5

| Sample No. | Porcelain starting materials | Additive | Secondary calcination | Laser non-irradiated dielectric constant | Laser irradiated dielectric constant |
|---|---|---|---|---|---|
| 1 | BaTiO₃ Dy₂O₃ SiO₂ | CuO | 1350° C., 2 hrs | 25,000 | 1200 |
| 2 | ↑ | MnO₂ | ↑ | 30,000 | 1500 |
| 3 | ↑ | Tl₂O₃ | ↑ | 40,000 | 1800 |

EXAMPLE 14

Figure 40:
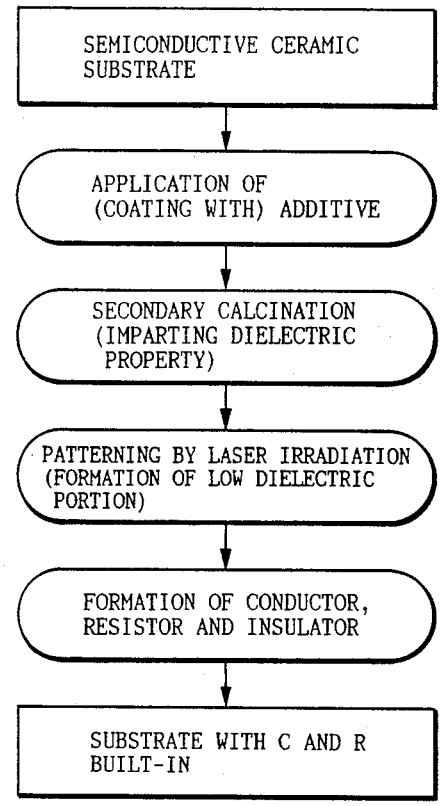
Figure 41:
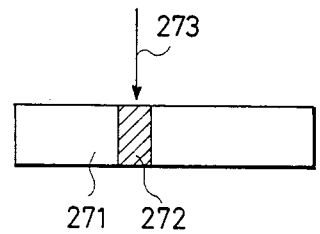

FIG. 40 shows other steps for preparation of a porcelain substrate which is an example of the present invention. In this example, after the semiconductor porcelain substrate is coated with additives, secondary calcination is performed to make the substrate dielectric material, followed by irradiation of laser 273 as shown in FIG. 41 to heat and melt the predetermined portion in the substrate once, thereby forming a low dielectric material portion. In FIG. 41, 271 is the high dielectric material portion, and 272 is the low dielectric material portion.

In the porcelain substrate obtained from the above steps, a high dielectric material portion and a low dielectric material portion can exist mixed within one substrate.

Thus, when laser irradiation is effected on the dielectric porcelain, it may be considered that the low dielectric material portion is formed, because the dielectric porcelain is once melted to destroy the initial crystalline structure, thereby forming a product made in a glass phase or similar to glass.

In this example, the initial crystalline grain sizes of 20μ are found to be changed to a rectangular structure of about 5μ similar to glass at the laser irradiated portion.

Table 6 shows the dielectric constants of the inner portion of the porcelain substrate according to this example.

TABLE 6

| Sample No. | Porcelain starting materials | Additive | Secondary calcination | Laser non-irradiated dielectric constant | Laser irradiated dielectric constant |
|---|---|---|---|---|---|
| 4 | BaTiO₃ Dy₂O₃ SiO₂ | CuO | 1350° C., 2 hrs | 25,000 | 300 |
| 5 | ↑ | MnO₂ | ↑ | 30,000 | 400 |

TABLE 6-continued

| Sample No. | Porcelain starting materials | Additive | Secondary calcination | Laser non-irradiated dielectric constant | Laser irradiated dielectric constant |
| --- | --- | --- | --- | --- | --- |
| 6 | ↑ | Tl$_2$O$_3$ | ↑ | 40,000 | 500 |

EXAMPLE 15

Figure 42:
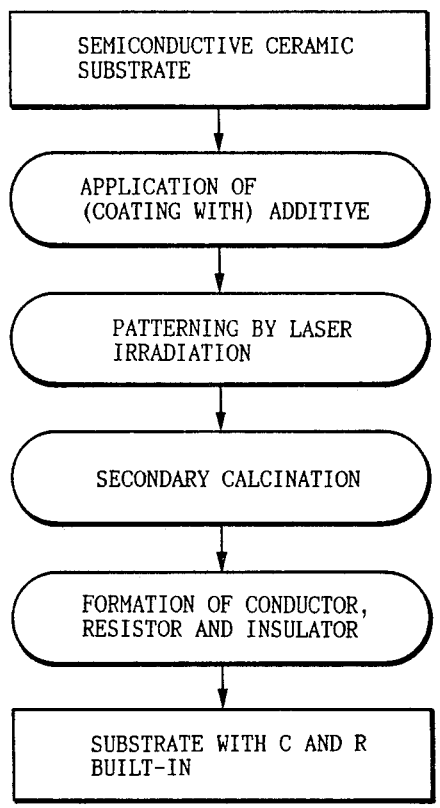
Figure 43:
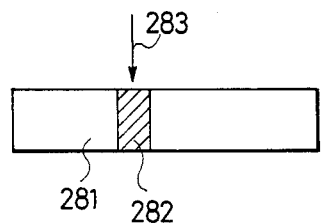

FIG. 42 shows other steps for preparation of a porcelain substrate which is an example of the present invention. In this example, after a semiconductor porcelain substrate is coated with additives, a laser 283 is irradiated as shown in FIG. 43 to heat and once melt the predetermined portion of the substrate, followed by cooling. In FIG. 43, 281 shows the original crystalline semiconductor porcelain portion and 282 the portion once melted by the laser. Then, secondary calcination is performed to make the porcelain substrate a dielectric material.

The porcelain substrate obtained from the above steps has a low dielectric constant at the portion once melted by laser irradiation and a high dielectric constant at the laser non-irradiated portion, whereby it is rendered possible that the low dielectric material portion and the high dielectric material portion exist mixed in one sheet of the substrate.

Thus, in the case of effecting laser irradiation after coating a semiconductor porcelain substrate with an additive and subsequently performing secondary calcination, the semiconductor porcelain is once melted to destroy the initial crystalline structure, whereby a product made in a glass phase or similar to glass can be formed. When this is subjected to secondary calcination, it is recrystallized, but the crystals formed are different from those at the laser non-irradiated portion to produce a low dielectric material portion.

EXAMPLE 16

At the high dielectric material portions of the dielectric material porcelain substrates obtained in Examples 13, 14, 15, conductor layers are formed by use of a thick film technique to provide electrodes, thus forming capacitors. By forming predetermined insulators, conductors, resistors on the capacitors by use of the thick film technique as mentioned above, porcelain substrates having built-in R, C are obtained.

Figure 44A:
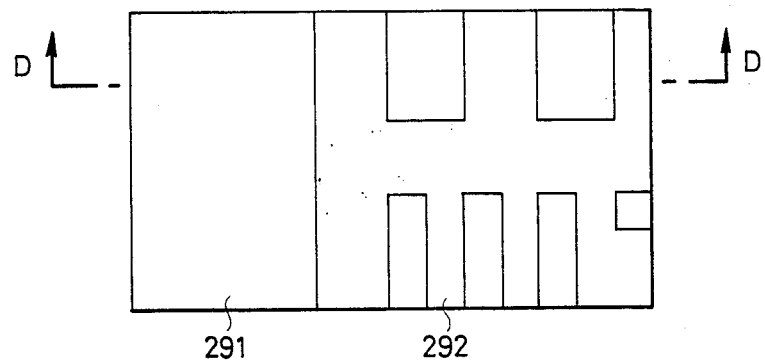
Figure 44B:
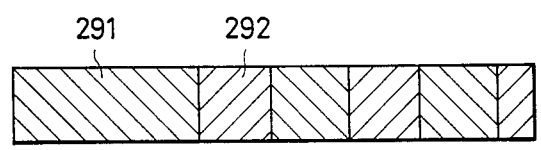
Figure 44C:
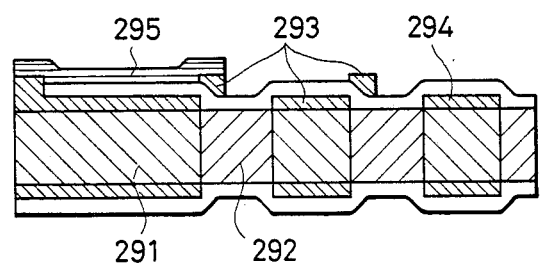

FIG. 44 shows an example of the porcelain substrate of the present invention obtained by the steps as shown in the above Example. FIGS. 44A and 44B are a plan view and a sectional view cut along D—D in FIG. 44A, respectively, 291 being the high dielectric material portion and 292 being the low dielectric material portion. FIG. 44C shows the electronic circuit substrate having a further formed conductor portion 293, resistor portion 294 and insulator portion 295 formed thereon.

EXAMPLE 17

Figure 45:
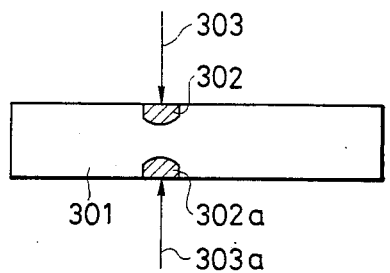

Following the preparation steps shown in FIG. 38, a porcelain substrate which is an example of the present invention is prepared. In this Example, the semiconductor porcelain substrate after primary calcination is subjected to laser irradiation as shown in FIG. 45 (in the figure, from the directions of the arrowheads 303, 303$a$), whereby the surface layer portion at the predetermined site in both main faces of the substrate are heated to be melted once, followed by cooling. In FIG. 45, 301 shows the original crystalline semiconductor porcelain portion and 302 the portion once melted by laser irradiation. Next, the porcelain substrate is applied with a metal or an oxide thereof, and second calcination is performed. The porcelain substrate obtained from the above steps has a low dielectric constant at the portion melted once by laser irradiation and a high dielectric constant at the laser non-irradiated portion, whereby it is rendered possible to obtain a porcelain substrate in which a low dielectric material portion and a high dielectric material portion exist mixed in one sheet of substrate.

Thus, when effecting laser irradiation on a semiconductor porcelain, the semiconductor porcelain is once melted by laser irradiation to destroy the initial crystalline structure, whereby a product made in a glass phase or similar to glass can be formed. In this example, the crystal grains with initial sizes of about 20$\mu$ are found to be changed to angular structures of about 5$\mu$ similar to glass. When this is coated with an additive and subjected to secondary calcination, recrystallization occurs, but the crystals formed are different from those at the laser non-irradiated portion to produce a low dielectric material portion. In this example, crystals and columnar crystals of about 8$\mu$ slightly smaller than the initial crystals are found to be formed.

Table 7 shows the dielectric constants of the inner portion of the porcelain substrate. The laser employed here is carbon dioxide laser. And, in this Example, a sample of 20×35, t=0.7 is used as the porcelain substrate. Measurement is conducted at room temperature at 1 kHz.

TABLE 7

| Sample No. | Porcelain starting materials | Additive | Secondary calcination | Laser non-irradiated dielectric constant | Laser irradiated dielectric constant |
| --- | --- | --- | --- | --- | --- |
| 1 | BaTiO$_3$ Dy$_2$O$_3$ SiO$_2$ | CuO | 1350° C., 2 hrs | 25,000 | 1500 |
| 2 | ↑ | MnO$_2$ | ↑ | 30,000 | 1900 |
| 3 | ↑ | Tl$_2$O$_3$ | ↑ | 40,000 | 2200 |

Further, on the high dielectric material portion of the dielectric porcelain substrate obtained in Example 17, conductor layers are formed by use of a thick film technique to provide electrodes, thus forming capacitors. By forming a predetermined insulator, conductor and resistor on the capacitor layer by use of the same thick film technique as mentioned above, a porcelain substrate having built-in R, C is obtained.

In Example 17 or in the following Examples 18 and 19, the portions partially melted by laser irradiation are provided on the respective surface layer portions on the both main faces of the porcelain substrate, but the present invention is not so limited. For example, it can also be provided only at the surface layer portion of one of the main faces.

EXAMPLE 18

Figure 46:
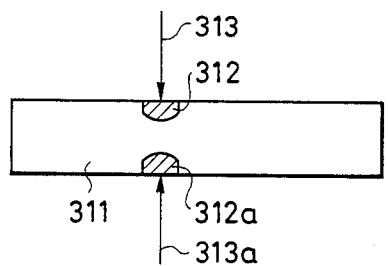

Following the preparation steps as shown in FIG. 40, a porcelain substrate which is an example of the present invention is prepared. In this example, after a semiconductor porcelain substrate is coated with an additive, secondary calcination is performed to make it dielectric material and then a low dielectric material portion is formed by heating and melting the predetermined portion in the substrate once by laser irradiation 313, 313a as shown in FIG. 46 similarly as in Example 17. In FIG. 46, 311 is a high dielectric material portion and 312, 312a is a low dielectric material portion.

In the porcelain material obtained from the above steps, a high dielectric material portion and a low dielectric material portion can exist mixed within one substrate.

Thus, when the dielectric porcelain is subjected to laser irradiation, it may be considered that the low dielectric portion is formed, because the dielectric porcelain is once melted to destroy the initial crystalline structure, whereby a product is made in a glass phase or a product similar to glass is formed.

In this Example, the initial crystal grains with sizes of 20$\mu$ are found to be changed to angular structures similar to glass with sizes of 5$\mu$ at the laser irradiated portion.

Table 8 shows the dielectric constants at the inner portion of the porcelain substrates according to this example.

TABLE 8

| Sample No. | Porcelain starting materials | Additive | Secondary calcination | Laser non-irradiated dielectric constant | Laser irradiated dielectric constant |
|---|---|---|---|---|---|
| 4 | $BaTiO_3$ $Dy_2O_3$ $SiO_2$ | CuO | 1350° C., 2 hrs | 25,000 | 400 |
| 5 | ↑ | $MnO_2$ | ↑ | 30,000 | 600 |
| 6 | ↑ | $Tl_2O_3$ | ↑ | 40,000 | 800 |

Further, conductor layers are formed at the high dielectric material portion of the dielectric porcelain substrate obtained in Example 18 by use of a thick film technique to provide electrodes, thus forming a capacitor. By forming on this substrate a predetermined insulator, conductor and resistor by use of the same thick film technique as mentioned above, a porcelain substrate having built-in R, C is obtained.

EXAMPLE 19

Figure 47:
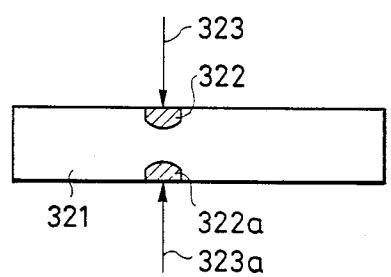

Following the preparation steps shown in FIG. 42, a porcelain substrate which is an example of the present invention is prepared. In this example, after semiconductor porcelain substrate is coated with an additive, it is heated and once melted at the predetermined portion in the substrate by laser irradiation 323, 323a similarly as in Example 17, followed by cooling. In FIG. 47, 321 shows the original crystalline semiconductor porcelain portion, 322, 322a the portions once melted by laser. Next, the porcelain substrate is made dielectric material by carrying out secondary calcination.

The porcelain substrate obtained from the above steps has a low dielectric constant at the portion once melted by laser irradiation and a high dielectric constant at the laser non-irradiated portion, whereby it is rendered possible that the low dielectric material portion and the high dielectric material portion exist mixed within one sheet of substrate.

As described above, in the case of coating a semiconductor porcelain substrate with an additive, then effecting laser irradiation thereon and thereafter carrying out secondary calcination, the semiconductor porcelain is once melted to destroy the initial crystalline structure, whereby a product made in a glass phase or similar to glass is formed. When this is subjected to secondary calcination, recrystallization occurs but the crystals obtained are different from those at the laser non-irradiated portion to produce a low dielectric material portion.

Further, conductor layers are formed at the high dielectric material portion of the dielectric porcelain substrate obtained in Example 19 by use of the thick film technique to provide electrodes, thus forming a capacitor. By forming a predetermined insulator, conductor and resistor on the porcelain substrate by use of the same thick film technique as mentioned above, a porcelain substrate having built-in R, C is obtained.

Figure 48A:
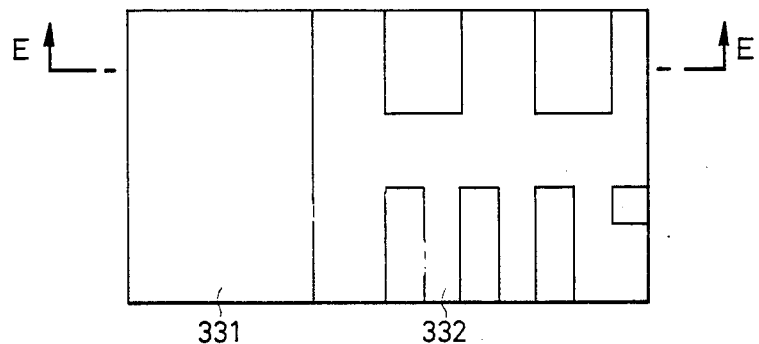
Figure 48B:
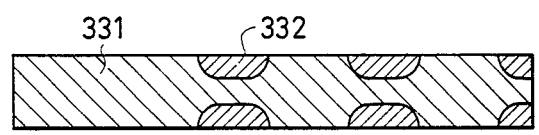
Figure 48C:
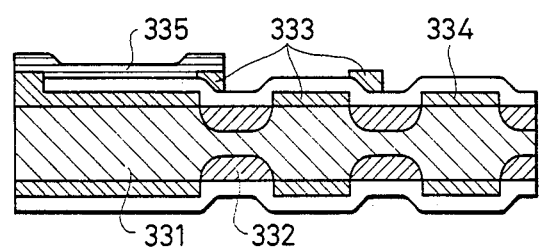

FIG. 48 shows an example of the porcelain substrate of the present invention obtained by the steps as shown in the above Example. FIGS. 48A and 48B show a plan view of the porcelain substrate and a sectional view cut along E—E in FIG. 48A, respectively, 331 being the high dielectric material portion and 332 being the low dielectric material portion. FIG. 48C shows the electronic circuit substrate having a further formed conductor portion 333, resistor portion 334 and insulator portion 335 thereon.

EXAMPLE 20

Figure 49:
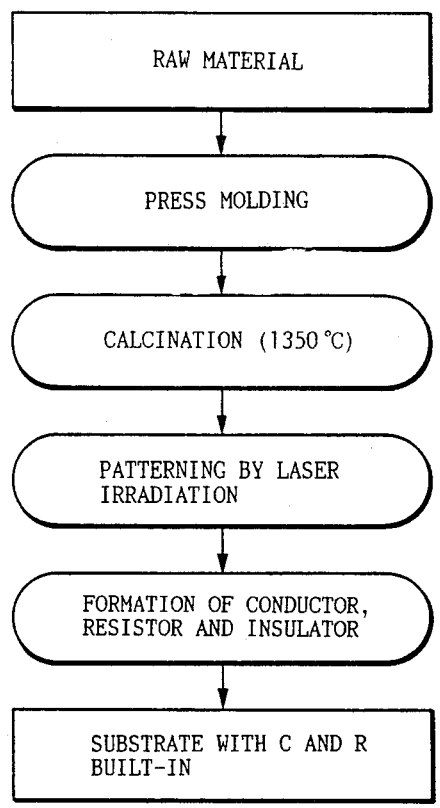
Figure 50:
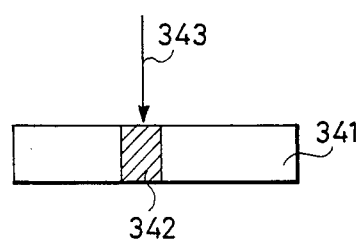

FIG. 49 shows the steps for preparation of a porcelain substrate which is an example of the present invention. In this Example, after a composition as shown in Table 9 is calcined, the predetermined portion in the substrate is heated to be once melted by laser irradiation, and then cooled. In FIG. 50, 341 is the original crystalline dielectric material porcelain portion and 342 is the portion once melted by laser irradiation 343. The porcelain substrate obtained from the above steps has a low dielectric constant at the portion once melted by laser and a high dielectric constant at the laser non-irradiated portion, whereby it is rendered possible to obtain a porcelain substrate in which a low dielectric material portion and a high dielectric material portion exist mixed within one sheet of substrate. Table 10 shows the dielectric constants at the laser irradiated portion and non-irradiated portion.

TABLE 9

| Material | $BaTiO_3$ | $CeO_2$ | $TiO_2$ | $SiO_2$ |
|---|---|---|---|---|
| Composition (mol %) | 93.6 | 3.2 | 2.2 | 1.0 |

TABLE 10

| | $\epsilon$ |
|---|---|
| Laser irradiated portion | 2,000 |
| Laser non-irradiated portion | 11,000 |

By forming predetermined conductor portion, resistor portion and insulator portion on the above sintered product, a substrate having built-in C, R can be obtained.

EXAMPLE 21

Figure 51:
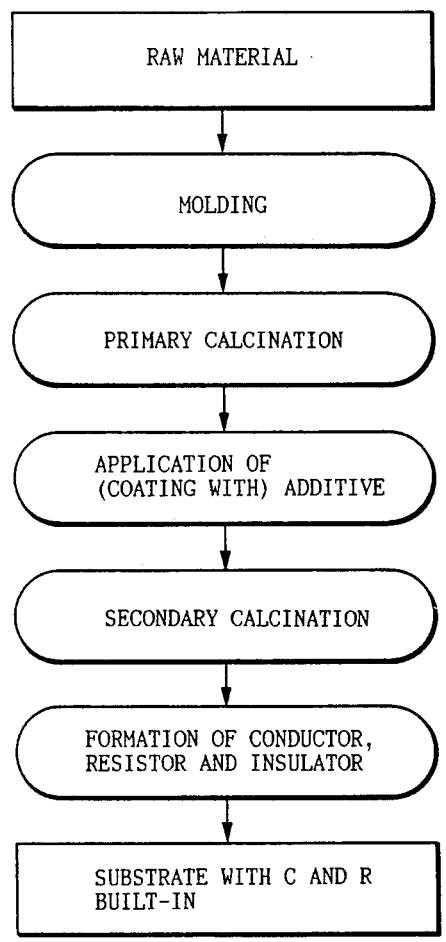

FIG. 51 shows a flow chart of the steps in this example. In this example, starting materials are filled as shown FIG. 52 during press molding. That is the spaces 353 and 354 partitioned by the partitioning plate 352 which can be removed after filling of the starting materials are filled with the starting material powder as shown in the Formulation table 1 shown below and the space 355 with the starting material powder shown in the Formulation table 2 shown below, and press molding is performed with the partitioning plate being removed. By calcining the sintered product following steps as shown in FIG. 51, a sintered product as shown in FIG. 53 can be obtained.

Here, 361 and 362 in the Figure are portions comprising the composition as shown in the Formulation table 1 shown below, while 363 is the portion comprising the composition as shown in the Formulation table 2 shown below, and each dielectric constant of the respective portions is shown below in Table 11. From this sintered product, a CR built-in substrate can be obtained by forming a predetermined conductor portion, resistor portion and insulator portion on the above sintered product having a high dielectric constant portion and a low dielectric constant portion in one sheet of substrate.

(Formulation table 1)
$BaTiO_3$ 93.6% $CeO_2$ 3.2% $TiO_2$ 2.2% $SiO_2$ 1.0%
(Formulation table 2)
$BaTiO_3$ 85.0% $MgTiO_3$ 10.2% $Nb_2O_5$ 1.0% $TiO_2$ 2.8% $SiO_2$ 1.0%

TABLE 11

| | $\epsilon$ |
|---|---|
| 361, 362 | 11,000 |
| 363 | 3,000 |

EXAMPLE 22

Figure 54:
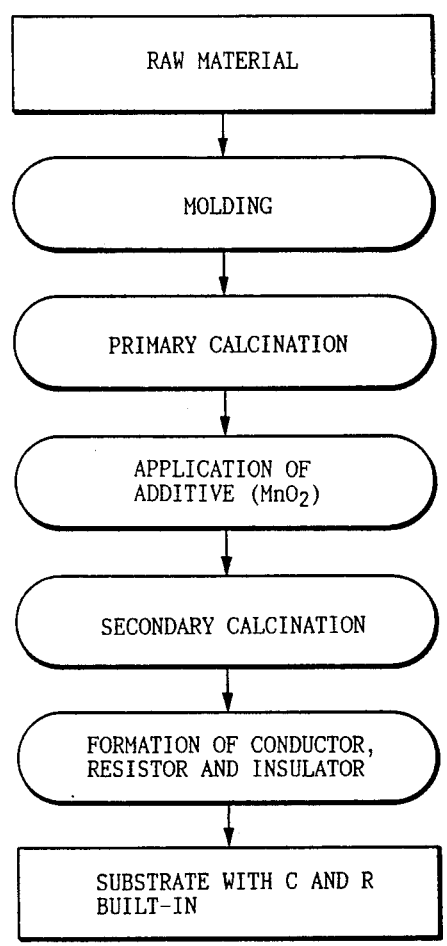
Figure 55:
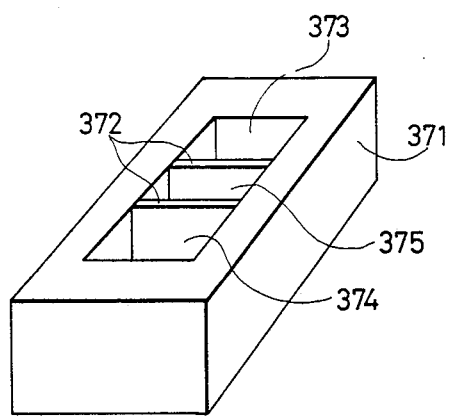

FIG. 54 shows a flow chart of the steps of this Example. In this Example, starting materials are filled as shown in FIG. 55 during press molding. That is, the spaces 373 and 374 partitioned by a thin partitioning plate 372 made of a substance which is decomposed at high temperature (e.g. polyvinyl alcohol) are filled with the starting material powder shown below in the Formulation table 3 and the space 375 is filled with the starting material shown below in the Formulation table 4 and press molding is performed. Here, the partitioning plate decomposed at high temperature should preferably be one having a large number of small perforations. If small perforations are possessed by the plate, the materials molded adjacent to each other through the partitioning plate will be separated with little probability when the partitioning plate is decomposed at high temperature.

Figure 56:
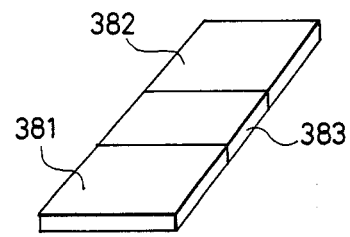

By calcining this molded product following the steps as shown in FIG. 54, a sintered product as shown in FIG. 56 can be obtained. Here, the portions 381 and 382 will become semiconductors after primary calcination, since they contain sufficient $La_2O_3$. And, since the grain boundaries can be insulated by coating these portions with an additive followed by calcination, these portions have a high dielectric constant, while the portion 383 has a low dielectric constant, because it cannot be made sufficiently into a semiconductor after primary calcination due to the reduced amount of $La_2O_3$. The Table 12 below shows the dielectric constants of the respective portions.

(Formulation table 3)
$BaTiO_3$ 93.0% $BaSnO_2$ 2.0% $La_2O_3$ 0.12% $SiO_2$ 2.0% $Al_2O_3$ 1.88% $SrTiO_3$ 1.0%
(Formulation table 4)
$BaTiO_3$ 93.0% $BaSnO_2$ 2.0% $La_2O_3$ 0.02% $SiO_2$ 2.1% $Al_2O_3$ 1.88% $SrTiO_3$ 4.0%

TABLE 12

| | Resistance after primary calcination | $\epsilon$ |
|---|---|---|
| 381, 382 | 300 $\Omega \cdot$ cm | 40,000 |

TABLE 12-continued

| | Resistance after primary calcination | $\epsilon$ |
|---|---|---|
| 383 | 20 k$\Omega \cdot$ cm | 7,000 |

The sintered product has a high dielectric constant portion and a low dielectric portion within one sheet of porcelain substrate.

By forming a predetermined conductor portion, resistor portion and insulator portion on the above sintered product, a C, R built-in substrate can be obtained.

EXAMPLE 23

Figure 52:
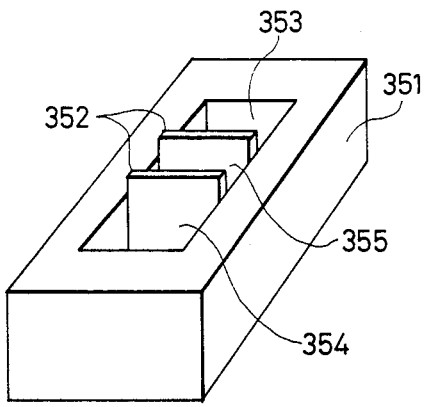
FIG. 52 and FIG. 55 are each schematic perspective view showing an example of the mold for molding in preparation of the ceramic of the present invention.
Figure 53:
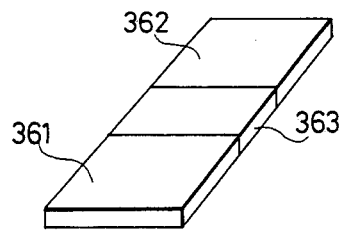
FIG. 53 and FIG. 56 are each a schematic perspective view of the ceramic of the present invention obtained by the above mold for molding.

In this Example, following the flow chart of the steps as shown in FIG. 51, starting materials are filled as shown in FIG. 52 during press molding. That is, the spaces 353 and 354 partitioned by a partitioning plate 351 which can be removed after filling of the starting materials are filled with the starting material powder shown below in the Formulation table 5 and the space 355 is filled with a starting material powder shown below in the Formulation table 6, and press molding is performed with the partitioning plate being removed. By calcining the sintered product following the steps in FIG. 51 a sintered product as shown in FIG. 53 can be obtained. As the additive, $MnO_2$ is employed. Here, the portions 361 and 362 are converted to semiconductors after primary calcination, and boundary insulation effected by coating these portions with the additive followed by calcination to give a high dielectric constant, while the portion 363 has a low dielectric constant due to insufficient conversion to a semiconductor. Dielectric constants of the respective portions are shown in the Table 13 shown below. This sintered product has a high dielectric constant portion and a low dielectric portion in one sheet of substrate. A C, R built-in substrate can be obtained by forming a predetermined conductor portion, resistor portion and insulator portion on the above sintered product.

(Formulation Table 5)
$BaTiO_3$ 93.0% $BaSnO_2$ 2.0% $La_2O_3$ 0.12% $SiO_2$ 2.0% $Al_2O_3$ 1.88% $SrTiO_3$ 1.0%
(Formulation table 6)
$BaTiO_3$ 85.0% $MgTiO_3$ 10.2% $TiO_2$ 2.8% $SiO_2$ 1.0% $SrTiO_3$ 1.0%

TABLE 13

| | $\epsilon$ |
|---|---|
| 361, 362 | 40,000 |
| 363 | 3,000 |

EXAMPLE 24

In this example, following the flow chart of the steps shown in FIG. 54, starting materials are filled as shown in FIG. 55 during press molding. That is the spaces 373 and 374 partitioned by a thin partitioning plate 372 made of a substance which is decomposed at high temperature (e.g. polyvinyl alcohol) are filled with the starting material powder as shown in the above Formulation table 3 and the space 375 is filled with the starting material as shown in the above Formulation table 4 and press molding is performed. Here, the partitioning plate decomposed at a high temperature should preferably be on having a large number of small perforations. If small perforations are possessed by the plate, the materials molded adjacent to each other through the partitioning plate will be separated with little probability.

By calcining this molded product following the steps as shown in FIG. 54, a sintered product as shown in FIG. 56 can be obtained.

In this Example, both main faces of the portions 381 and 382 after calcination are coated with $MnO_2$ as the diffusion layer source, while the both faces of the portion 383 are coated with CuO.

Here, the portions 381, 382 are converted into semiconductors after primary calcination similarly as in Example 22, and are further subjected to secondary calcination with coating of $MnO_2$ whereby they develop high dielectric constants. In contrast, the portion 383 has not been converted sufficiently to semiconductor after calcination similarly as in Example 22, and is further subjected to secondary calcination with a coating of CuO, whereby it develops a low dielectric cinstant. Also, by employing different additives for example, the temperature coefficient, tan δ, the voltage resistance of the condenser, etc., can be varied, and also the breadth in choice of the kinds of dielectric materials can be increased to a great extent. The following Table 14 shows the dielectric constants of the respective portions.

TABLE 14

|  | Resistivity after primary calcination | ε |
|---|---|---|
| 381, 382 | 300 Ω · cm | 30,000 |
| 383 | 20 kΩ · cm | 4,000 |

This sintered product has a high dielectric constant portion and a low dielectric constant portion within one sheet of porcelain substrate.

A C, R built-in substrate can be obtained by forming a predetermined conductor portion, resistor portion and insulator portion on the above sintered product.

EXAMPLE 25

In this example, following the flow chart of the steps as shown in FIG. 51, starting materials are filled as shown in FIG. 52 during press molding. That is, the spaces 353 and 354 partitioned by a partitioning plate 353 which can be removed after filling of the starting materials are filled with the starting material powder as in the above Formulation table 5 under space 355 filled with a starting material powder as in the above Formulation table 6, and press molding is performed with the partitioning plate being removed. By calcining the sintered product following the steps in FIG. 51, a sintered product as shown in FIG. 53 can be obtained.

In this Example, both main faces of the portions 361 and 362 after calcination are coated with $MnO_2$ as the diffusion layer source, while the both faces of the portion 363 are coated with CuO.

Here, the portions 361, 362 are converted into semiconductors after primary calcination similarly as in Example 23, and are further subjected to secondary calcination with a coating of $MnO_2$ whereby they develop high dielectric constants. In contrast, the portion 363 has not been converted sufficiently to a semiconductor after calcination similarly as in Example 23, and is further subjected to secondary calcination with a coating of CuO, whereby it develops a low dielectric constant. The following Table 15 shows the dielectric constants of the respective portion.

TABLE 15

|  | ε |
|---|---|
| 361, 362 | 40,000 |
| 363 | 2,000 |

This sintered product has a high dielectric constant portion and a low dielectric constant portion within one sheet of porcelain substrate.

A C, R built-in substrate can be obtained by forming a predetermined conductor portion, resistor portion and insulator portion on the above sintered product.

EXAMPLE 26

Communicating holes (shaped in grooves) having respective openings at both faces of a $BaTiO_3$ type porcelain substrate are bored, and a substrate is calcined with $PbSiO_3$ filled in the communicating holes. Thus, a porcelain substrate having built therein a plural number of $BaTiO_3$ type high dielectric material portions separated from one another with $PbSiO_3$ having low dielectric constant sandwiched therebetween is obtained. FIG. 31 shows an example of the porcelain substrate obtained according to the method as shown in the above example. FIGS. 31A and 31B are a plan view of the porcelain substrate and its sectional view cut along the line C—C in FIG. 31A, 201 being the high dielectric material portion and 202 being the low dielectric material portion. FIG. 31C shows the electronic circuit substrate having further formed the conductor portion 203, the resistor portion 204, and insulator portion 205, respectively, thereon.

EXAMPLE 27

Figure 57:
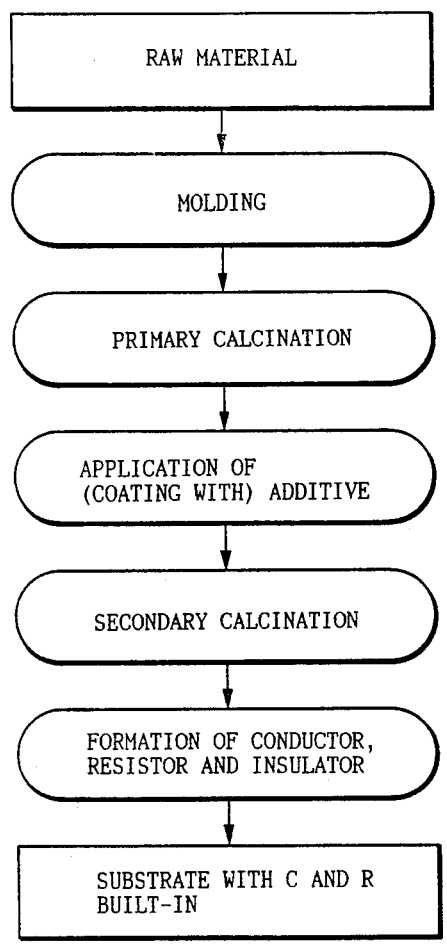

FIG. 57 shows the flow chart of the steps of this Example. In this Example, starting materials are filled as shown in FIG. 52 during press molding. That is, the spaces 353 and 354 partitioned by a thin partitioning plate 352 made of a substance which is decomposed at high temperature (e.g. polyvinyl alcohol) are filled with the starting material powder shown below in the Formulation table 7 and the space 355 is filled with the starting material shown below in the Formulation table 8 and press molding is performed. Here, the partitioning plate decomposed at high temperature should preferably be one having a large number of small perforations. If small perforations are possessed by the plate, the materials molded adjacent to each other through the partitioning plate will be separated with little probability when the partitioning plate is decomposed at high temperature.

By calcining this molded product following the steps as shown in FIG. 57, a sintered product as shown in FIG. 53 can be obtained. Here, $MnO_2$ is employed as the additive. Here, the portions 361 and 362 have a high dielectric constant due to sufficient grain growth in the sintered product, because there exists a sufficient amount of $SiO_2$ contributing to grain growth, while the portion 363 a has low dielectric constant due to insufficient grain growth in the sintered product, because $SiO_2$ contributing to grain growth is supressed.

Table 16 shown below shows the respective average grain sizes and dielectric constants ε of the high dielectric material portions 361, 362 and the low dielectric material portion 363.

(Formulation table 7)

| BaTiO$_3$ | 93.0%, | BaSnO$_2$ | 2.0%, |
|---|---|---|---|
| La$_2$O$_3$ | 0.12%, | SiO$_2$ | 2.0%, |
| Al$_2$O$_3$ | 1.88%, | SrTiO$_3$ | 1.0%. |

(Formulation table 8)

| BaTiO$_3$ | 94.9%, | BaSnO$_2$ | 2.0%, |
|---|---|---|---|
| La$_2$O$_3$ | 0.12%, | SiO$_2$ | 0.1%, |
| Al$_2$O$_3$ | 1.88%, | SrTiO$_3$ | 1.0%. |

TABLE 16

| | Average grain size | ε |
|---|---|---|
| 361, 362 | 20 μm | 40,000 |
| 363 | 3 μm | 8,000 |

A C, R built-in substrate can be obtained by forming a predetermined conductor portion, resistor portion and insulator portion on the above sintered product.

EXAMPLE 28

Figure 58:
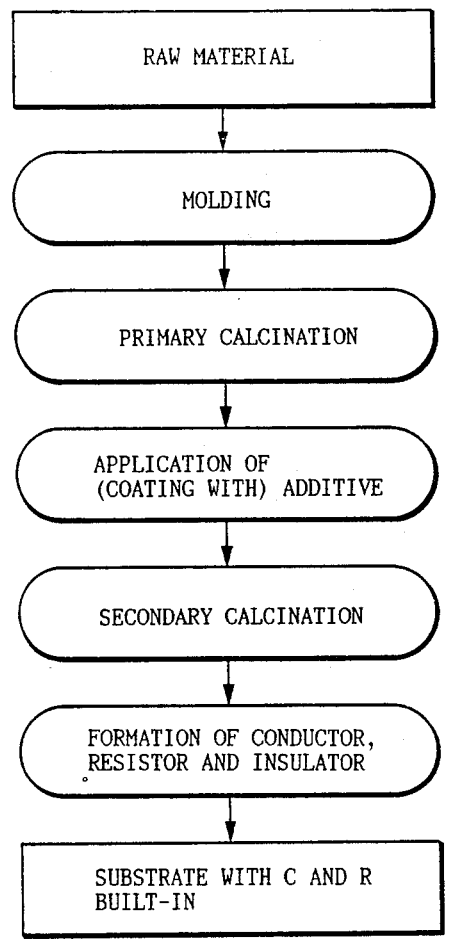

FIG. 58 shows the flow chart of the steps in this Example. Starting materials are filled as shown in FIG. 55 during press molding. That is, the spaces 373 and 374 partitioned by a partitioning plate 372 which can be removed after filling of the starting materials are filled with the starting material powder shown below in the Formulation table 9 and the space 375 is filled with the starting material shown below in the Formulation table 10, and press molding is performed with the partitioning plate being removed. By calcining this sintered product following the steps shown in FIG. 58, a sintered product as shown in FIG. 56 is obtained. As the additive, MnO is used. Here, the portions 381 and 382 have a high dielectric constant because grain growth is sufficient in the sintered product due to the presence of a sufficient amount of SiO$_2$ and also because they are converted sufficiently to semiconductors due to the presence of a sufficient amount of La$_2$O$_3$. In contrast, the portion 383 has a low dielectric constant because grain growth is insufficient in the sintered product due to a reduced amount of SiO$_2$ and also because it is insufficiently converted to a semiconductor due to an insufficient amount of La$_2$O$_3$. The respective dielectric constants ε are shown in Table 17. This sintered product has a high dielectric constant portion and a low dieletric constant portion within one sheet of substrate. A C, R built-in substrate can be obtained by forming a predetermined conductor portion, resistor portion and insulator portion on the above sintered product.

(Formulation table 9)

| BaTiO$_3$ | 93.0%, | BaSnO$_2$ | 2.0%, |
|---|---|---|---|
| La$_2$O$_3$ | 0.12%, | SiO$_2$ | 2.0%, |
| Al$_2$O$_3$ | 1.88%, | SrTiO$_3$ | 1.0%. |

(Formulation table 10)

| BaTiO$_3$ | 93.0%, | BaSnO$_2$ | 2.0%, |
|---|---|---|---|
| La$_2$O$_3$ | 0.02%, | SiO$_2$ | 0.1%, |
| Al$_2$O$_3$ | 1.88%, | SrTiO$_3$ | 1.0%. |

TABLE 17

| | ε |
|---|---|
| 381, 382 | 40,000 |
| 383 | 6,500 |

EXAMPLE 29

In this Example, following the flow chart of the steps as shown in FIG. 58, starting materials are filled as shown in FIG. 55 during press molding. That is, the spaces 373 and 374 partitioned by a partitioning plate 372 which can be removed after filling of the starting materials are filled with the starting material powder shown below in the Formulation table 11 and the space 375 is filled with the starting material shown below in the Formulation table 12, and press molding is performed with the partitioning plate being removed. By calcining this sintered product following the steps shown in FIG. 58, a sintered product as shown in FIG. 56 is obtained. As the additive. MnO$_2$ is used. Here, the portions 381 and 382 have a high dielectric constant due to use of the starting material shown in the Formulation table 11 and sufficient grain growth, while the portion 383 has a low dielectric constant due to use of the starting material shown in the Formulation table 12 and insufficient grain growth. The respective dielectric constants ε are shown in Table 18. This sintered product has a high dielectric constant portion and a low dielectric constant portion within one sheet of substrate. A CR built-in substrate can be obtained by forming a predetermined conductor portion, resistor portion and insulator portion on the above sintered product.

(Formulation table 11)

| BaTiO$_3$ | 93%, | BaSnO$_2$ | 2.0%, |
|---|---|---|---|
| La$_2$O$_3$ | 0.12%, | SiO$_2$ | 2.0%, |
| Al$_2$O$_3$ | 1.88%, | SrTiO$_3$ | 1.0%. |

(Formulation table 12)

| BaTiO$_3$ | 85.9%, | MgTiO$_3$ | 10.2%, |
|---|---|---|---|
| TiO$_2$ | 2.8%, | SiO$_2$ | 0.1% |
| SrTiO$_3$ | 1.0%. | | |

TABLE 18

| | ε |
|---|---|
| 381, 382 | 40,000 |
| 383 | 3,200 |

EXAMPLE 30

FIG. 57 shows the flow chart of the steps of this Example. In this Example, starting materials are filled as shown in FIG. 52 during press molding. That is, the spaces 353 and 354 partitioned by a thin partitioning plate 352 made of a substance which is decomposed at high temperature (e.g. polyvinyl alcohol) are filled with the starting material powder shown below in the Formulation table 13 and the space 355 is filled with the starting material shown below in the Formulation table 14 and press molding is performed. Here, the partitioning plate decomposed at a high temperature should preferably be one having a large number of small perforations. If small perforations are possessed by the plate, the materials molded adjacent to each other through the partitioning plate will be separated with little probability when the partitioning plate is decomposed at a high temperature.

By calcining this molded product following the steps as shown in FIG. 57, a sintered product as shown in FIG. 53 can be obtained. Here, the additives coated are $MnO_2$ for the portions 361, 362 of the molded product and CuO for the portion 363. Here, the portions 361, 362 have a high dielectric constant because grain growth is sufficient in the sintered product due to the presence of a sufficient amount of $SiO_2$ contributing to grain growth and also because $MnO_2$ is employed as the grain boundary insulating material. In contrast, the portion 363 has a low dielectric constant because grain growth is insufficient in the sintered product due to the reduced amount $SiO_2$ which contributes to grain growth and also because CuO is used as the grain boundary insulating material.

The Table 19 shows the respective dielectric constants of the high dielectric material portions 361, 362 and the low dielectric material portion 363.

| (Formulation table 13) | | | |
|---|---|---|---|
| $BaTiO_3$ | 93.0%, | $BaSnO_2$ | 2.0%, |
| $La_2O_3$ | 0.12%, | $SiO_2$ | 2.0%, |
| $Al_2O_3$ | 1.88%, | $SrTiO_3$ | 1.0%. |

| (Formulation table 14) | | | |
|---|---|---|---|
| $BaTiO_3$ | 94.9%, | $BaSnO_2$ | 2.0%, |
| $La_2O_3$ | 0.12%, | $SiO_2$ | 0.1%, |
| $Al_2O_3$ | 1.88%, | $SrTiO_3$ | 1.0%. |

TABLE 19

| | $\epsilon$ |
|---|---|
| 361, 362 | 40,000 |
| 363 | 5,000 |

A C, R built-in substrate can be obtained by forming a predetermined conductor portion, resistor portion and insulator portion on the above sintered product.

EXAMPLE 31

In this example, following the flow chart of the steps as shown in FIG. 58, starting materials are filled as shown in FIG. 55 during press molding. That is the spaces 373 and 374 partitioned by a partitioning plate 372 which can be removed after filling of the starting materials are filled with the starting material powder shown below in the Formulation table 15 and the space 375 is filled with the starting material shown in the Formulation table 16, and press molding is performed with the partitioning plate being removed. By calcining this sintered product following the steps shown in FIG. 58, a sintered product as shown in FIG. 56 is obtained. The additives coated are $MnO_2$ for the portions 381, 382 of the molded product and CuO for the portion 383. Here, the portions 381, 382 have a high dielectric constant due to the composition shown in the Formulation table 15, sufficient grain growth and use of $MnO_2$ as the grain boundary insulating material, while the portion 383 has a low dielectric constant due to the composition shown in the Formulation table 16, insufficient grain growth and use of CuO as the grain boundary insulating material. The respective dielectric constants are shown in Table 20. This sintered product has a high dielectric constant portion and a low dielectric constant portion within one sheet of substrate. A CR built-in substrate can be obtained by forming a predetermined conductor portion, resistor portion and insulator portion on the above sintered product.

| (Formulation table 15) | | | |
|---|---|---|---|
| $BaTiO_3$ | 93%, | $BaSnO_2$ | 2.0%, |
| $La_2O_3$ | 0.12%, | $SiO_2$ | 2.0%, |
| $Al_2O_3$ | 1.88%, | $SrTiO_3$ | 1.0%. |

| (Formulation table 16) | | | |
|---|---|---|---|
| $BaTiO_3$ | 85.9%, | $MgTiO_3$ | 10.2%, |
| $TiO_2$ | 2.8%, | $SiO_2$ | 0.1%, |
| $SrTiO_3$ | 1.0%. | | |

TABLE 20

| | $\epsilon$ |
|---|---|
| 381, 382 | 40,000 |
| 383 | 2,800 |

FIG. 31 shows an example of the porcelain substrate obtained by the method as shown in the above example. FIGS. 31A and 31B are a plan view of the porcelain substrate and its sectional view cut along C—C in FIGS. 31A, 201 being the high dielectric material portion and 202 the low dielectric material portion. FIG. 31C shows the electronic circuit substrate having further the conductor portion 203, the resistor portion 204 and the insulator portion 205 formed thereon.

EXAMPLE 32

Figure 59:
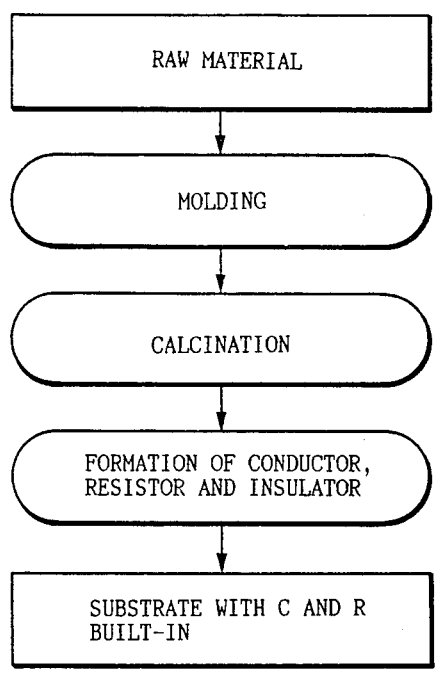

FIG. 59 shows the flow chart of the steps in this Example. In this Example, starting materials are filled as shown in FIG. 52 during press molding. That is, the spaces 353 and 354 partitioned by a partitioning plate 352 which can be removed after filling of the starting materials are filled with the starting material powder with a composition shown in the Table 21 containing an ordinary amount of binder (2 wt. %), and the space 355 is filled with a starting material powder with a composition shown in the Table 21 containing 35 wt. % of binder, and press molding is performed with the partitioning plate being removed. By calcining this sintered product following the steps shown in FIG. 59, a sintered product as shown in FIG. 53 is obtained. Here, the portions 361 and 362 have a high dielectric constant because the dielectric material porcelain is dense on account of the ordinary amount of binder, while the portion 363 has a low dielectric constant because the large amount of binder produces a porous structure after removal of the binder. The respective dielectric constants $\epsilon$ are shown in Table 22. This sintered product has a high dielectric constant portion and a low dielectric constant portion within one sheet of substrate. A CR built-in substrate can be obtained by forming a predetermined conductor portion, resistor portion and insulator portion on the above sintered product.

TABLE 21

| Material | BaTiO$_3$ | CeO$_3$ | TiO$_2$ | SiO$_2$ |
| --- | --- | --- | --- | --- |
| Composition (mol %) | 93.6 | 3.2 | 2.2 | 1.0 |

TABLE 22

| | $\epsilon$ |
| --- | --- |
| 361, 362 | 11,000 |
| 363 | 6,000 |

EXAMPLE 33

FIG. 59 shows the flow chart of the steps in this Example. In this Example, starting material are filled as shown in FIG. 52 during press molding. That is, the spaces 353 and 354 partitioned by a partitioning plate 352 which can be removed after filling of the starting materials are filled with the starting material powder with a composition shown in the Formulation table 17 containing an ordinary amount of binder (2 wt. %), and the space 355 is filled with a starting material powder with a composition shown in the Formulation table 18 containing 35 wt. % of binder, and press molding is performed with the partitioning plate being removed. By calcining this sintered product following the steps shown in FIG. 59, a sintered product as shown in FIG. 53 is obtained. Here, the portions 361 and 362 have a high dielectric constant because the composition is as shown in the Formulation table 17 and the dielectric material porcelain is dense on account of the ordinary amount of binder, while the portion 363 has a low dielectric constant because the composition is as shown in the Formulation table 18 and the large amount of binder produces a porous structure after removal of the binder. The respective dielectric constants $\epsilon$ are shown in Table 23. This sintered product has a high dielectric constant portion and a low dielectric constant portion within one sheet of substrate. A CR built-in substrate can be obtained by forming a predetermined conductor portion, resistor portion and insulator portion on the above sintered product.

| (Formulation table 17) | | | |
| --- | --- | --- | --- |
| BaTiO$_3$ | 93.6%, | CeO$_2$ | 3.2%, |
| TiO$_2$ | 2.2%, | SiO$_2$ | 1.0%. |

| (Formulation table 18) | | | |
| --- | --- | --- | --- |
| BaTiO$_3$ | 85.0%, | MgTiO$_3$ | 10.2%. |
| Nb$_2$O$_3$ | 1.0%, | TiO$_2$ | 2.8%, |
| SiO$_2$ | 1.0%. | | |

TABLE 23

| | $\epsilon$ |
| --- | --- |
| 361, 362 | 11,000 |
| 363 | 2,000 |

EXAMPLE 34

FIG. 59 shows the flow chart of the steps in this Example. In this Example, starting materials are filled as shown in FIG. 52 during press molding. That is, the spaces 353 and 354 partitioned by a partitioning plate 352 which can be removed after filling of the starting materials are filled with the starting material powder with a composition shown below in the Formulation table 19 containing an ordinary amount of binder (2 wt. %), and the space 355 is filled with a starting material powder with a composition shown below in the Formulation table 19 containing 35 wt. % of binder, and press molding is performed with the partitioning plate being removed. By calcining this sintered product following the steps shown in FIG. 59, a sintered product as shown in FIG. 53 is obtained. Here, the portions 361 and 362 have a high dielectric constant because the dielectric material porcelain is dense on account of ordinary amount of binder, while the portion 363 has a low dielectric constant because the large amount of binder produces a porous structure after removal of the binder. The respective dielectric constants $\epsilon$ are shown in Table 24. This sintered product has a high dielectric constant portion and a low dielectric constant portion within one sheet of substrate. A CR built-in substrate can be obtained by forming a predetermined conductor portion, resistor portion and insulator portion on the above sintered product.

| (Formulation table 19) | | | |
| --- | --- | --- | --- |
| BaTiO$_3$ | 93.0%, | BaSnO$_2$ | 2.0%, |
| La$_2$O$_3$ | 0.12%, | SiO$_2$ | 2.0%, |
| Al$_2$O$_3$ | 1.88%, | SrTiO$_3$ | 1.0%. |

TABLE 24

| | $\epsilon$ |
| --- | --- |
| 361, 362 | 40,000 |
| 363 | 9,000 |

EXAMPLE 35

FIG. 57 shows the flow chart of the steps in this Example. In this Example, starting materials are filled as shown in FIG. 55 during press molding. That is, the spaces 373 and 374 partitioned by a thin partitioning plate 372 made of a substance which is decomposed at high temperature (e.g. polyvinyl alcohol) are filled with the starting material powder shown below in the Formulation table 20 and the space 375 is filled with the starting material shown below in the Formulation table 21 and press molding is performed. Here, the partitioning plate decomposed at high temperature should preferably be one having a large number of small perforations. If small perforations are possessed by the plate, the materials molded adjacent to each other through the partitioning plate will be separated with little probability when the partitioning plate is decomposed at high temperature. By calcining the molded product following the steps shown in FIG. 57, a sintered product as shown in FIG. 56 is obtained. As the additive, MnO$_2$ is used. Here, the portions 381 and 382 have a high dielectric constant because they are converted sufficiently to semiconductors after primary calcination due to presence of a sufficient amount of La$_2$O$_3$ and also because they are made sufficiently dense due to the ordinary amount of the binder. In contrast, the portion 383 has a low dielectric constant because it is not converted sufficiently to a semiconductor after primary calcination due to a supressed amount of La$_2$O$_3$, and also because the sintered product after calcination becomes porous due to the large amount of the binder. The respective dielectric constants $\epsilon$ are shown in the Table 25 below.

(Formulation table 20)

| | | | |
|---|---|---|---|
| BaTiO$_3$ | 93%, | BaSnO$_2$ | 2.0%, |
| La$_2$O$_3$ | 0.12%, | SiO$_2$ | 2.0%, |
| Al$_2$O$_3$ | 1.88%, | SrTiO$_3$ | 1.0% |

In the above composition, an ordinary binder amount is used (2 wt. %).

(Formulation table 21)

| | | | |
|---|---|---|---|
| BaTiO$_3$ | 93.1%, | BaSnO$_2$ | 2.0%, |
| La$_2$O$_3$ | 0.02%, | SiO$_2$ | 2.0%, |
| Al$_2$O$_3$ | 1.88%, | SrTiO$_3$ | 1.0% |

In the above composition, 35 wt. % of binder is used.

TABLE 25

| | $\epsilon$ |
|---|---|
| 381, 382 | 40,000 |
| 383 | 5,000 |

EXAMPLE 36

By use of a mold as shown in FIG. 55, following the flow chart in FIG. 57, by filling the spaces 373, 374 with the starting material shown below in the Formulation table 22 and by filling the space 375 with the starting material shown below in the Formulation table 23, press molding is performed. By calcining the molded product following the flow chart in FIG. 57, a sintered product as shown in FIG. 56 is obtained. As the additive, MnO$_2$ is used. As a result, the portions 381, 382 become higher in the dielectric constant because they are sufficiently converted to semiconductors and the porcelain is dense. In contrast, the portion 383 becomes lower in the dielectric constant because it is not sufficiently converted to semiconductor and also because it is porous. The respective dielectric constants $\epsilon$ are shown below in Table 26.

(Formulation table 22)

| | | | |
|---|---|---|---|
| BaTiO$_3$ | 93%, | BaSnO$_2$ | 2.0%, |
| La$_2$O$_3$ | 0.12%, | SiO$_2$ | 2.0%, |
| Al$_2$O$_3$ | 1.88%, | SrTiO$_3$ | 1.0% |

In the above composition, an ordinary binder amount is used (2 wt. %).

(Formulation table 23)

| | | | |
|---|---|---|---|
| BaTiO$_3$ | 85.0%, | MgTiO$_3$ | 10.2%, |
| TiO$_2$ | 2.8%, | SiO$_2$ | 1.0%, |
| SrTiO$_3$ | 1.0% | | |

In the above composition, 35 wt. % of binder is used.

TABLE 26

| | $\epsilon$ |
|---|---|
| 381, 382 | 40,000 |
| 383 | 3,000 |

EXAMPLE 37

FIG. 57 shows the flow chart of the steps of this Example. In this Example, starting materials are filled as shown in FIG. 55 during press molding. That is, the spaces 373 and 374 partitioned by a thin partitioning plate 372 made of a substance which is decomposed at high temperature (e.g. polyvinyl alcohol) are filled with the starting material powder shown below in the Formulation table 24 and the space 375 is filled with the starting material shown below in the Formulation table 25 and press molding is performed. Here, the partitioning plate decomposed at a high temperature should preferably be one having a laree number of small perforations. If small perforations are possessed by the plate, the materials molded adjacent to each other through the partitioning plate will be separated with little probability when the partitioning plate is decomposed at high temperature. By calcining the molded product following the steps shown in FIG. 57, a sintered product as shown in FIG. 56 is obtained. As the additive, MnO$_2$ is employed for the portions 381, 382 and CuO for the portion 383. Here, the portions 381 and 382 have a high dielectric constant because they are sufficiently converted to semiconductors after primary calcination due to presence of a sufficient amount of La$_2$O$_3$ and also because they are made sufficiently dense due to the ordinary amount of the binder, and because MnO$_2$ is employed as the grain boundary insulating material. In contrast, the portion 383 has a low dielectric constant because it is not sufficiently converted to semiconductor after primary calcination due to a reduced amount of La$_2$O$_3$, and also because the sintered product after calcination becomes porous due to the large amount of the binder, and because CuO is used as the grain boundary insulating material. The respective dielectric constants $\epsilon$ are shown in the Table 27 below.

(Formulation table 24)

| | | | |
|---|---|---|---|
| BaTiO$_2$ | 93%, | BaSnO$_2$ | 2.0%, |
| La$_2$O$_3$ | 0.12%, | SiO$_2$ | 2.0%, |
| Al$_2$O$_3$ | 1.88%, | SrTiO$_3$ | 1.0% |

In the above composition, an ordinary binder amount is used (2 wt. %).

(Formulation table 25)

| | | | |
|---|---|---|---|
| BaTiO$_3$ | 93.1%, | BaSnO$_2$ | 2.0%, |
| La$_2$O | 0.02%, | SiO$_2$ | 2.0%, |
| Al$_2$O$_3$ | 1.88%, | SrTiO$_3$ | 1.0% |

In the above composition, 35 wt. % of binder is used.

TABLE 27

| | $\epsilon$ |
|---|---|
| 381, 382 | 40,000 |
| 383 | 3,000 |

EXAMPLE 38

FIG. 57 shows the flow chart of the steps in this Example. In this Example, starting materials are filled as shown in FIG. 55 during press molding. That is, the spaces 373 and 374 partitioned by a thin partitioning plate 372 made of a substance which is decomposed at high temperature (e.g. polyvinyl alcohol) are filled with the starting material powder shown below in the Formulation table 26 and the space 375 is filled with the starting material shown below in the Formulation table 27 and press molding is performed. Here, the partitioning plate decomposed at high temperature should preferably be one having a large number of small perforations. If small perforations are possessed by the plate, the materials molded adjacent to each other through the partitioning plate will be separated with little probability when the partitioning plate is decomposed at high temperature. By calcining the molded product following the steps shown in FIG. 57, a sintered product as shown in FIG. 56 is obtained. As the additive, $MnO_2$ is used. Here, the portions 381 and 382 have a high dielectric constant because grain growth is sufficient in the sintered product due to presence of a sufficient amount of $SiO_2$ contributing to grain growth and they are converted sufficiently to semiconductors after primary calcination due to presence of sufficient amount of $La_2O_3$ and also because they are made sufficiently dense due to the ordinary amount of the binder. In contrast, the portion 383 has a low dielectric constant because grain growth is insufficient due to a reduced amount of $SiO_2$ contributing to grain growth and it is not sufficiently converted to semiconductor after primary calcination due to a reduced amount of $La_2O_3$, and also because the sintered product after calcination becomes porous due to the large amount of binder. The respective dielectric constants $\epsilon$ are shown in the Table 28 below.

(Formulation table 26)

| | | | |
|---|---|---|---|
| $BaTiO_3$ | 93%, | $BaSnO_2$ | 2.0%, |
| $La_2O_3$ | 0.12%, | $SiO_2$ | 2.0%, |
| $Al_2O_3$ | 1.88%, | $SrTiO_3$ | 1.0% |

In the above composition, an ordinary binder amount is used (2 wt. %).

(Formulation table 27)

| | | | |
|---|---|---|---|
| $BaTiO_3$ | 95%, | $BaSnO_2$ | 2.0%, |
| $La_2O_3$ | 0.02%, | $SiO_2$ | 0.1%, |
| $Al_2O_3$ | 1.88%, | $SrTiO_3$ | 1.0% |

In the composition, 35 wt. % of binder is used.

TABLE 28

| | $\epsilon$ |
|---|---|
| 381, 382 | 40,000 |
| 383 | 3,000 |

FIG. 31 shows an example of the porcelain substrate obtained by the method as shown in the above Example 38. FIGS. 31A and 31B are a plan view of the porcelain substrate and its sectional view cut along C—C in FIG. 31A, 201 being the high dielectric material portion and 202 the low dielectric material portion. FIG. 31C shows the electronic circuit substrate having further the conductor portion 203, the resistor portion 204 and the insulator portion 205 formed thereon.

EXAMPLE 39

Figure 60:
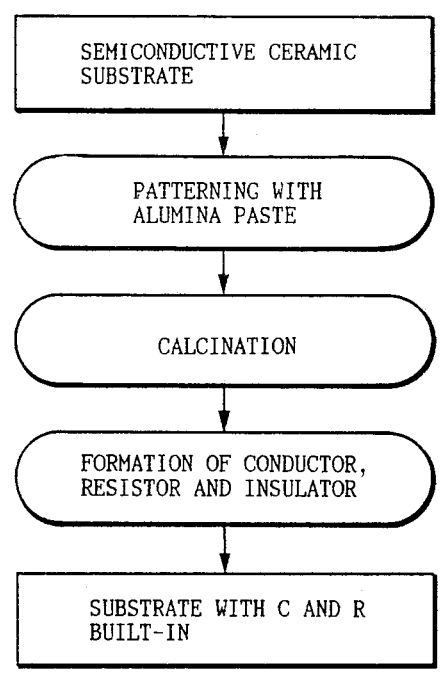
Figure 62:
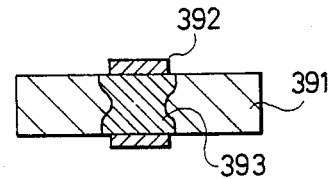
FIG. 62 is a schematic sectional view showing the state of the molded product after calcination.

FIG. 60 shows the steps according to Example 39 of the present invention. In this Example as shown in 61, a dielectric porcelain 391 composed mainly of barium titanate is coated with alumina paste (containing silica) 392 as the material which absorbs the component of the molded product at the predetermined portion of the porcelain. Next, this is calcined in an atmosphere of air. Since the barium titanate which is the main component of the dielectric porcelain is thermally diffused into alumina by this calcination, the dielectric material porcelain becomes porous 393, whereby the dielectric constant at the portion coated with alumina paste of the dielectric material porcelain is lowered (FIG. 62). Table 29 shows the experimental results of this Example. In the experiments in this Example, the test is conducted by coating a plate-shaped barium titanate dielectric material porcelain of 20×30 mm with alumina paste on half of the plate (with different silica contents) for examination of the dielectric constant. Diffusion of barium titanate into alumina can be confirmed by X-ray microanalyzer.

In the porcelain substrate obtained by the above procedure, a high dielectric constant portion and a low dielectric constant portion exist in one sheet of substrate.

TABLE 29

| Main components | Coated alumina paste | | $\epsilon$ |
|---|---|---|---|
| Barium titanate | None | | 10,000 |
| ↑ | Alumina | 90% | 7,000 |
| | Silica | 10% | |
| ↑ | Alumina | 60% | 3,000 |
| | Silica | 40% | |

By forming conductor layers on the high dielectric constant portion among them to provide electrodes, thus forming a capacitor, on which is formed a predetermined insulator, conductor and resistor by utilization of the thick film technique, whereby an electronic circuit substrate having RC built therein can be obtained.

EXAMPLE 40

A ceramic is prepared in the same manner as in Example 39 except for changing the main component of the molded product to strontium titanate. Dielectric constants are measured to obtain the results shown in Table 30.

TABLE 30

| Main components | Coated alumina paste | | $\epsilon$ |
|---|---|---|---|
| Strontium titanate | None | | 40,000 |
| ↑ | Alumina | 90% | 30,000 |
| | Silica | 10% | |
| ↑ | Alumina | 60% | 8,000 |
| | Silica | 40% | |

EXAMPLE 41

Figure 63:
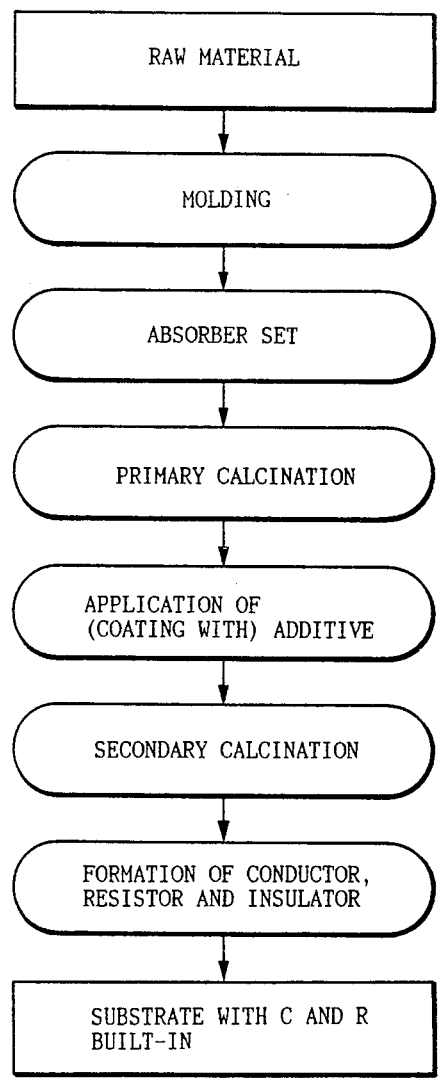
Figure 64:
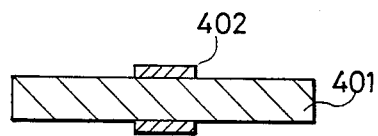
FIG. 64 is a schematic sectional view showing the state in which a plate of an absorbing material is brought into contact with the molded product.
Figure 65:
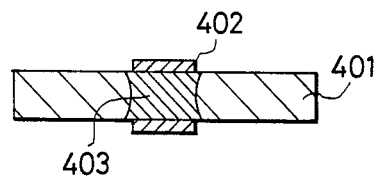
FIG. 65 is a schematic sectional view showing the state of the molded product after calcination.

FIG. 63 shows the steps according to Example 41 of the present invention. In this Example, as shown in FIG. 63, a molded product from the starting material composed mainly of barium titanate (containing $SiO_2$, $La_2O_3$) is calcined in a reducing atmosphere with either of the plates of $Al_2O_3$ and MgO contacted on the molded product 401 to obtain a primary calcined product provided with a region 403 (FIG. 65) having the main component absorbed onto said plate. Then, the absorbing plate is removed and secondary calcination is conducted with coating of an additive to make the product dielectric. FIG. 31 shows the experimental results of this Example. In the experiments in this Example, calcination is conducted with $Al_2O_3$ plate of MgO plate contacted on half of a plate-shaped molded product of 24 ×36 mm.

TABLE 31

| Main components | plate | ε |
|---|---|---|
| Barium titanate | None | 10,000 |
| ↑ | Al₂O₃ | 4,000 |
| ↑ | MgO | 7,000 |

EXAMPLE 42

Figure 66:
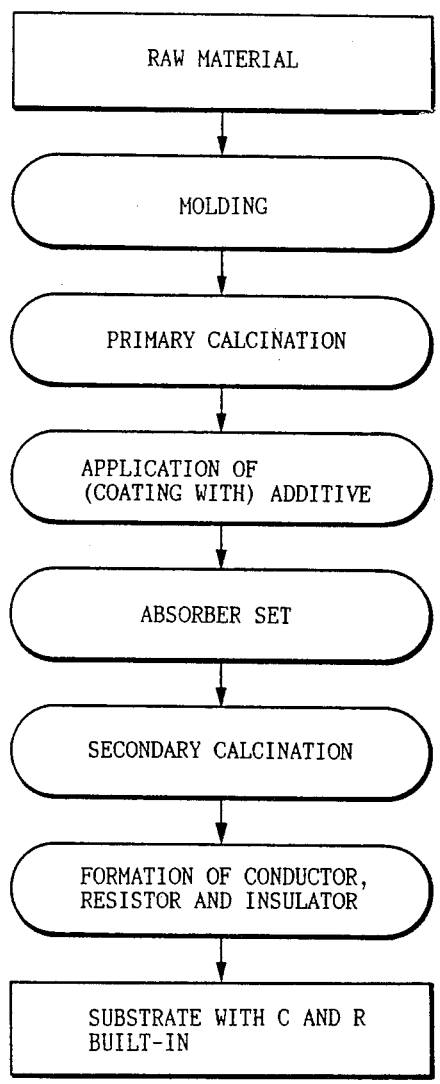

FIG. 66 shows the steps according to Example 42 of the present invention.

Figure 67:
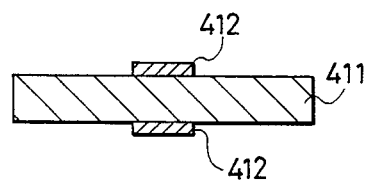
FIG. 67 is a schematic sectional view showing the state in which after coating the primarily calcined product with an additive, an absorbing material sheet is brought into contact therewith.
Figure 68:
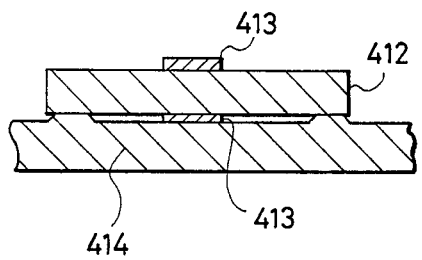
FIG. 68 is a schematic sectional view showing the state in which after coating the primarily calcined product with an additive, an absorbing material powder is brought into contact therewith

In this Example, as shown in FIG. 66, the primary calcined product composed mainly of barium titanate is coated with an additive and then subjected to secondary calcination with either one of a sheet of a mixture of Al₂O₃ and SiO₂ or powder of a mixture of Al₂O₃, SiO₂ being contacted thereon. The arrangements are shown in FIGS. 67 and 68, in which 411 is the primary calcined product, 412 is the sheet of the absorbing material, 413 is the powder of absorbing material and 414 is a setter. The results of this Example are shown in Table 32.

TABLE 32

| Main components | Absorbing material | ε |
|---|---|---|
| Barium titanate | None | 10,000 |
| ↑ | Al₂O₃ 90%, SiO₂ 10% sheet | 7,000 |
| ↑ | Al₂O₃ 60%, SiO₂ 40% sheet | 5,000 |
|  | Al₂O₃ 60%, SiO₂ 40% powder | 4,500 |

FIG. 31 shows an example of the porcelain substrate obtained by the method as shown in the above Example 39. FIGS. 31A and 31B are a plan view of the porcelain substrate and its sectional view cut along C—C in FIG. 31A, 201 being the high dielectric material portion and 202 being the low dielectric material portion. FIG. 31C shows the electronic circuit substrate having further the conductor portion 203, the resistor portion 204 and the insulator portion 205 formed thereon.

The ceramic of the present invention can be formed by sectionalization of a plural number of the functional portions of electronic part constituting units, etc. Accordingly, the electronic circuit substrate of the present invention constituted by use of this can have a plural number of functional portions of devices such as capacitors with various capacities built therein. For example, by forming various functional portions such the conductor, resistor, insulator, etc., on the above substrate, an electronic circuit substrate can be obtained which is provided with many functional portions, yet miniaturized and inexpensive. Also, degree of freedom in designing of capacitors, resistances, etc., within the electronic circuit substrate can be thus improved to a great extent.

Particularly, for example, the electronic circuit substrate of the present invention having a plural number of capacitors built therein, by providing a region of low dielectric material mutually between the high dielectric materials at the portions forming said plural number capacitors, has the desirable effect that these individual capacitors can function completely independently of each other without mutual cross-talk between the plural number of capacitors.

We claim:

1. A ceramic comprising therein two or more dielectric portions having different dielectric constants formed by filling of one or more vacant spaces provided within a dieletric porcelain, with one or more kinds of materials capable of developing different dielectric constants from said dielectric porcelain and by subsequent calcination, wherein a semiconductor procelain is a precursor of said dielectric porcelain and a molded product is a precursor of said semiconductor porcelain.

2. A ceramic according to claim 1, wherein said vacant space is a concavity or a groove provided at the surface layer portion of said dielectric porcelain, said semiconductor porcelain or said molded product.

3. A ceramic according to claim 1, wherein said vacant space is a communicated hole having openings respectively on the different surfaces of said dielectric porcelain, said semiconductor porcelain or said molded product.

4. A ceramic according to claim 1, wherein the material filled into said space has a dielectric constant lower than that of said dielectric porcelain, said ceramic having two or more portions with higher dielectric constant separated from each other with the portion of said low dielectric constant sandwiched therebetween.

5. An electronic circuit substrate comprising a ceramic, comprising therein two or more dielectric portions having different dielectric constant formed by filling of one or mroe vacant spaces provided within a dielectric porcelain with one or more kinds of materials capable of developing different dieletric constants from said dielectric porcelain and by subsequent calcination, and wherein said ceramic further comprises a conductor provided internally or on the surface of said ceramic, wherein a semiconductor porcelain is a precursor of said dielectric porcelain and a molded product is a precursor of said semiconductor porcelain.

6. An electronic circuit substrate according to claim 5, wherein said vacant space is a concavity or a groove provided at the surface layer portion of said dielectric porcelain, said semiconductor porcelain or said molded product.

7. An electronic circuit substrate according to claim 5, wherein said vacant space is a communicated hole having openings respectively on the different surfaces of said dielectric porcelain, said semiconductor porcelain or said molded product.

8. An electronic circuit substrate according to claim 5, wherein the material filled into said space has a dielectric constant lower than that of said dielectric porcelain, said ceramic having two or more portions with higher dielectric constant separated from each other with the portion of said low dielectric constant sandwiched therebetween.

9. An electronic circuit substrate according to claim 5, further having a resistor and/or an insulator internally or on the surface of said ceramic.

10. An electronic circuit substrate according to claim 8, further having a resistor and/or an insulator internally or on the surface of said ceramic.

11. A method for producing a ceramic, which comprises the steps of:
providing a vacant space in a dielectric porcelain, a semiconductor porcelain being a precursor of said dielectric porcelain and a molded product being a precursor of said semiconductor porcelain;
filling said vacant space with a material having a different dielectric constant from said dielectric porcelain; and
calcining the material thereby to form a portion with a different dielectric constant.

12. A method according to claim 11, wherein said vacant space is a concavity or a groove provided at the surface layer portion of said dielectric porcelain, said semiconductor porcelain or a said molded product.

13. A method according to claim 11, wherein said vacant space is a communicated hole having openings respectively on the different surfaces of said dielectric porcelain, said semiconductor porcelain or said molded product.

14. A method according to claim 11, wherein the material filled into said vacant space has a dielectric constant lower than that of said dielectric porcelain, and the portions with higher dielectric constant around said vacant space are separated from each other with said lower dielectric constant portion sandwiched therebetween.

15. A ceramic comprising therein two or more dielectric portions having different dielectric constants formed by:
packing of two or more kinds of ceramic forming grain groups capable of developing different dielectric constants into a mold and separated from one another by use of partition plates; and
subsequent calcination of said ceramic forming grain groups.

16. A ceramic according to claim 15, having two of more of said high dielectric constant portions separated from each other with said low dielectric constant portion sandwiched therebetween.

17. An electronic substrate comprising a ceramic and a conductor provided internally or on a surface of said ceramic, said ceramic comprising therein two or more dielectric portions having different dielectric constants formed by:
packing of two or more kinds of ceramic forming grain groups capable of developing different dielectric constants into a mold and separated from one another by use of partition plates; and
subsequent calcination of said ceramic forming grain groups.

18. An electronic circuit substrate according to claim 17, wherein said ceramic has two or more of said high dielectric constant portions separated from each other with said low dielectric constant portion sandwiched therebetween.

19. An electronic circuit substrate according to claim 17, further having a resistor and/or an insulator internally or on the surface of said ceramic.

20. A method for producing a ceramic, which comprises the steps of:
forming a high dielectric constant portion and a low dielectric constant portion by calcining a ceramic forming grain group capable of developing a low dielectric constant, and packing said ceramic forming grain groups into a mold so that said ceramic forming grain groups are sectionalized from each other by use of a partitioning plate.

21. A method according to claim 20, wherein two or more high dielectric constant portions are formed separated from each other with said low dielectric constant portion sandwiched therebetween.

22. A ceramic comprising therein two or more dielectric portions having different dielectric constants formed by diffusion into a dielectric porcelain of a diffusion source material capable of lowering the dielectric constant of said dielectric porcelain.

23. A ceramic according to claim 22, having two or more high dielectric constant portions separated from each other with the portion in which said diffusion source capable of being made to have a low dielectric constant is diffused sandwiched therebetween.

24. A ceramic according to claim 22, wherein said diffusion source capable of being made to have a low dielectric constant is at least one selected from $MgTiO_3$, $SiO_2$ and $Al_2O_3$.

25. An electronic circuit substrate comprising a ceramic comprising therein two or more dielectric portions having different dielectric constants formed by diffusion into a dielectric porcelain of a diffusion source material capable of lowereing the dielectric constant of said dielectric porcelain, and a conductor provided internally or on the surface of said ceramic.

26. An electronic circuit substrate according to claim 25, wherein said ceramic has two or more high dielectric constant portions separated from each other with the portion in which said diffusion source capable of being made to have a low dielectric constant is diffused sandwiched therebetween.

27. An electronic circuit substrate according to claim 25, wherein said diffusion source capable of being made to have a low dielectric constant is at least one selected from $MgTiO_3$, $SiO_2$ and $Al_2O_3$.

28. An electronic circuit substrate according to claim 25, further having a resistor and/or an insulator internally or on the surface of said ceramic.

29. A method for producing a ceramic, which comprising the steps of:
forming a layer of a metal or a metal oxide on the surface of a semiconductor porcelain, then forming a layer of a diffusion source capable of developing a low dielectric constant partially on said layer and thereafter calcining the product, thereby forming two or more dielectric portions with different dielectric constants.

30. A method according to claim 29, wherein said diffusion source capable of being made to have a low dielectric constant is at least one selected from $MgTiO_3$, $SiO_2$ and $Al_2O_3$.

31. A method according to claim 29, wherein two or more high dielectric constant portions separated from each other with the portion in which said diffusion source capable of being made to have a low dielectric constant is diffused sandwiched therebetween are formed.

32. A method for forming a ceramic, which comprises the steps of:
forming a layer of a diffusion source capable of developing a lower dielectric constant partially on the surface of a dielectric porcelain and thereafter calcining the product, thereby forming two or more dielectric portions with different dielectric constants.

33. A method according to claim 32, wherein said diffusion source capable of being made to have a low dielectric constant is at least one selected from $MgTiO_3$, $SiO_2$ and $Al_2O_3$.

34. A method according to claim 32, wherein two or more high dielectric constant portions separated from each other with the portion in which said diffusion source capable of being made to have a low dielectric constant is diffused sandwiched therebetween are formed.

35. A ceramic comprising therein two or more dielectric portions having different dielectric constants formed by application of melting within a dielectric porcelain wherein, a semiconductor porcelain is a precursor of said dielectric porcelain and a molded product is a precursor of said semiconductor porcelain.

36. A ceramic according to claim 35, wherein the melted portion has a dielectric constant lower than that of said dielectric porcelain, which ceramic having two or more high dielectric constant portions separated from each other with said lower dielectric constant portion sandwiched therebetween.

37. An electronic circuit substrate comprising a ceramic and a conductor provided internally or in the surface of said ceramic, said ceramic comprising therein two or more dielectric portions having different dielectric constant formed by the application of melting within a dielectric porcelain, wherein a semiconductor porcelain is a precursor of said dielectric porcelain and a molded product is a precursor of said semiconductor porcelain.

38. An electronic circuit substrate according to claim 37, wherein the melted portion has a dielectric constant lower than that of said dielectric porcelain, which ceramic having two or more high dielectric constant portions separated from each other with said lower dielectric constant portion sandwiched therebetween.

39. An electronic circuit substrate according to claim 37, further having a resistor and/or an insulator internally or on the surface of said ceramic.

40. A method for producing a ceramic, which comprises the steps of:
partially melting of a dielectric porcelain thereby to form a portion with a different dielectric constant, wherein a semiconductor porcelain is a precursor of said dielectric porcelain and a molded product is a precursor of said semiconductor porcelain.

41. A method according to claim 40, wherein the melted portion has a dielectric constant lower than that of said dielectric porcelain and two or more high dielectric constant portions separated from each other with said lower dielectric constant portion sandwiched therebetween are formed.

42. A ceramic comprising therein two or more dielectric portions having different dielectric constants due to the difference in the content of a component necessary for conversion into a semiconductor.

43. An electronic circuit substrate comprising a ceramic comprising therein two or more dielectric portions having different dielectric constants due to the difference in the content of a component necessary for conversion into a semiconductor, and a conductor provided internally or on the surface of said ceramic.

44. A ceramic comprising therein two or more dielectric portions having different sized constituent grains and different dielectric constants due to the difference in the size of said constituent grains.

45. A ceramic according to claim 44, wherein said two or more dielectric portions with different dielectric constants have a low dielectric constant portion and two or more high dielectric portions separated from each other with said low dielectric constant portion sandwiched therebetween.

46. A ceramic according to claim 45, wherein said high dielectric constant portions have grain sizes of the constituent grains which are made 1.5-fold or more, by promotion of grain growth, of the grain sizes of the constituent grains at the portion where no promotion of grain growth is made.

47. A ceramic according to claim 45, wherein said low dielectric constant portion has grain sizes of the constituent grains which are made ⅔ or less, by supression of grain growth, of the grain sizes of the constituent grains at the portion where no supression of grain growth is made.

48. An electronic circuit substrate comprising a ceramic comprising therein two or more dielectric portions having different sized constituent grains and different dielectric constants due to the difference in the size of said constituent grains, and a conductor provided internally or on the surface of said ceramic.

49. An electronic circuit substrate according to claim 48, wherein said two or more dielectric portions with different dielectric constants have a low dielectric constant portion and two or more high dielectric portions separated from each other with said low dielectric constant portion sandwiched therebetween.

50. An electronic circuit substrate according to claim 49, wherein said high dielectric constant portions have grain sizes of the constituent grains which are made 1.5-fold or more, by promotion of grain growth, of the grain sizes of the constituent grains at the portion where no promotion of grain growth is made.

51. An electronic circuit substrate according to claim 49, wherein said low dielectric constant portion has grain sizes of the constituent grains which are made ⅔ or less, by supression of grain growth, of the grain sizes of the constituent grains at the portion where no supression of grain growth is made.

52. A ceramic comprising therein two or more dielectric portions having constituent materials of different densities and different dielectric constants due to the difference in the density of said constituent materials.

53. A ceramic according to claim 52, wherein said two or more dielectric portions with different dielectric constants have a low dielectric constant portion and two or more high dielectric portions separated from each other with said low dielectric constant portion sandwiched therebetween.

54. A ceramic according to claim 53, wherein the density of the constituent material at said high dielectric constant portions is made 1.1-fold or more, by increase of the density, of the density at the portion where no increase of density is made.

55. A ceramic according to claim 53, wherein the density of the constituent material of said low dielectric constant portion is made 10/11 or less, by decrease of density, of the density at the portion where no decrease of density is made.

56. An electronic circuit substrate comprising a ceramic comprising therein two or more dielectric portions having constituent materials of different densities and different dielectric constants due to the difference in the density of said constituent materials, and a conductor provided internally or on the surface of said ceramic.

57. An electronic circuit substrate according to claim 56, wherein said two or more dielectric portions with different dielectric constants have a low dielectric constant portion and two or more high dielectric portions separated from each other with said low dielectric constant portion sandwiched therebetween.

58. An electronics circuit substrate according to claim 57, wherein the density of the constituent material at said high dielectric constant portions is made 1.1-fold or more, by increase of the density of the density at the portion where no increase of density is made.

59. An electronics circuit substrate according to claim 57, wherein the density of the constituent material of said low dielectric constant portion is made 10/11 or less, by decrease of density, of the density at the portion where no decrease of density is made.

60. A method for producing a ceramic, which comprises the steps of:

imparting partially onto the surface of a dielectric porcelain a material capable of absorbing components for imparting of different dielectric portions with different dielectric constants to said porcelain and then calcining the product obtained, thereby forming two or more dielectric portions with different dielectric constants.

61. A method according to claim 60, wherein the material capable of absorbing said components is at least one selected from $SiO_2$, $Al_2O_3$, mixtures of $SiO_2$ and $Al_2O_3$, and MgO.

* * * * *

UNITED STATES PATENT AND TRADEMARK OFFICE
CERTIFICATE OF CORRECTION

PATENT NO. : 4,759,965          Page 1 of 8
DATED     : July 26, 1988
INVENTOR(S) : Keiichi Kato, et al.

It is certified that error appears in the above-identified patent and that said Letters Patent is hereby corrected as shown below:

IN THE PATENT ABSTRACT [57]

Line 7, "becoming" should read --being made--.

COLUMN 3

Line 14, "to still" should read --to a still--.
Line 68, "invention. FIG 27" should read
--invention. ¶FIG. 27--.

COLUMN 4

Line 2, "by use of the mold for molding" should read
    --made by use of a mold--.
Line 33, "each" should read --each a--.
Line 42, "product. FIG. 62" should read
    --product. ¶FIG. 62--.

COLUMN 5

Line 37, "Fe$_3$" should read --Fe$_2$O$_3$--.
Line 60, "as above" should read
    --as mentioned above--.

UNITED STATES PATENT AND TRADEMARK OFFICE
CERTIFICATE OF CORRECTION

PATENT NO. : 4,759,965

DATED : July 26, 1988

INVENTOR(S) : Keiichi Kato, et al.

It is certified that error appears in the above-identified patent and that said Letters Patent is hereby corrected as shown below:

COLUMN 7

Line 1, "thru hole" should read --thru-hole--.

COLUMN 8

Line 11, "$LiSiO_{3H}$," should read --$LiSiO_3$,--.
    Line 18, "space" should read --space.--.

COLUMN 9

Line 2, "eguipped" should read --equipped--.

COLUMN 10

Line 29, "gratn" should read --grain--.
    Line 49, "substance" should read --substances--. and
    Line 62, "other" should read --other.--.

COLUMN 11

Line 1, "of for example" should read --of, for example,--.

UNITED STATES PATENT AND TRADEMARK OFFICE
CERTIFICATE OF CORRECTION

PATENT NO. : 4,759,965

DATED : July 26, 1988

INVENTOR(S) : Keiichi Kato, et al.

Page 3 of 8

It is certified that error appears in the above-identified patent and that said Letters Patent is hereby corrected as shown below:

COLUMN 12

Line 1, "($CO_2$, laser," should read --$CO_2$ laser,--. and
Line 47, "$SiO_2$, content" should read --$SiO_2$ content--.

COLUMN 13

Line 4, "supressing" should read --suppressing--.

COLUMN 14

Line 4, "liguid" should read --liquid--.
Line 16-7, "powder. The" should read
    --powder. ¶The--.
Line 54, "eguipped" should read --equipped--.

COLUMN 15

Line 23, "filled" should read --are filled--.
Line 31, "stees" should read --steps--.
Line 49, "are plan" should read --are a plan--.
Line 50, "and the" should read --and a--.

UNITED STATES PATENT AND TRADEMARK OFFICE
CERTIFICATE OF CORRECTION

PATENT NO. : 4,759,965

DATED : July 26, 1988

INVENTOR(S) : Keiichi Kato, et al.

It is certified that error appears in the above-identified patent and that said Letters Patent is hereby corrected as shown below:

COLUMN 16

Line 15, "irradiatio" should read --irradiation--.

COLUMN 17

Line 10, "alone" should read --along--.
    Line 43, "TABLE 1" should read --TABLE 2--.

COLUMN 18

Line 28, "is I5 filled" should read --is filled--.
    Line 67-8, "measured  The" should read --measured.  The--.

COLUMN 19

Line 27, "254, and" should read --254, 255 and--.
    Line 28, "formed  For" should read --formed.  For--.
    Table 4, "253-254" should read --253-254--
           "253-254"                --254-255--.

UNITED STATES PATENT AND TRADEMARK OFFICE
CERTIFICATE OF CORRECTION

PATENT NO. : 4,759,965

DATED : July 26, 1988

INVENTOR(S) : Keiichi Kato, et al.

It is certified that error appears in the above-identified patent and that said Letters Patent is hereby corrected as shown below:

COLUMN 20

Line 3, "20ε" should read --20μ--.
    TABLE 5, "Cuo" should read --CuO--.

COLUMN 25

Line 10, "CR" should read --R,C--.

COLUMN 26

Line 67, "on" should read --one--.

COLUMN 27

Line 18, "cin" should read --con--. and
    Line 45, "353 which" should read --352 which--.

COLUMN 28

Line 61, "363 a has" should read --363 has a--.

COLUMN 30

Line 21, "additive." should read --additive,--.
    Line 31, "CR" should read --R,C--. and
    Line 45, "0.1%" should read --0.1%,--.

UNITED STATES PATENT AND TRADEMARK OFFICE
CERTIFICATE OF CORRECTION

PATENT NO. : 4,759,965

DATED : July 26, 1988

INVENTOR(S) : Keiichi Kato, et al.

It is certified that error appears in the above-identified patent and that said Letters Patent is hereby corrected as shown below:

COLUMN 32

Line 3, "CR" should read --R,C--.
    Line 32, "FIGS. 31A," should read --FIG. 31A,--. and
    Line 66, "CR" should read --R,C--.

COLUMN 33

Line 39, "CR" should read --R,C--. and
    Line 53, "$Nb_2O_3$" should read --$Nb_2O_5$--.

COLUMN 34

Line 19, "CR" should read --R,C--.

COLUMN 36

Line 14, "laree" should read --large--. and
    Line 51, "$La_2O$" should read --$La_2O_3$--.

COLUMN 37

Figure 61:
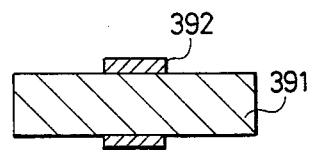
FIG. 61 is a schematic sectional view showing the state in which a paste of absorbing material is applied on the molded product.

Line 65, "in 61," should read --in FIG. 61,--.

UNITED STATES PATENT AND TRADEMARK OFFICE
CERTIFICATE OF CORRECTION

PATENT NO. : 4,759,965
DATED : July 26, 1988
INVENTOR(S) : Keiichi Kato, et al.

It is certified that error appears in the above-identified patent and that said Letters Patent is hereby corrected as shown below:

COLUMN 38

Line 35, "CR" should read --R,C--.

COLUMN 39

Line 54, "resistances," should read --resistors,--.

COLUMN 40

Line 1, "dieletric" should read --dielectric--.
    Line 24, "constant" should read --constants--.
    Line 25, "mroe" should read --more--.
    Line 27, "dieletric" should read --dielectric--.

COLUMN 41

Line 26, "of" should read --or--.
    Line 53, "a low" should read --a high dielectric constant and a ceramic forming grain group capable of developing a low--.

UNITED STATES PATENT AND TRADEMARK OFFICE
CERTIFICATE OF CORRECTION

PATENT NO. : 4,759,965
DATED : July 26, 1988
INVENTOR(S) : Keeichi Kato, et al.

It is certified that error appears in the above-identified patent and that said Letters Patent is hereby corrected as shown below:

COLUMN 42

Line 12, "lowereing" should read --lowering--.
Line 28-9, "com-/prising" should read --comprises--.
Line 50, "lower" should read --low--.
Line 68, "porcelain wherein," should read --porcelain, wherein--.

COLUMN 43

Line 10, "in" or --on--.
Line 13, "constant" should read --constants--.
Line 68, "supres-" should read --suppres---.

COLUMN 44

Line 2, "supression" should read --suppression--.
Line 25, "supression" should read --suppression--.
Line 26, "supres-" should read --suppres---.
Line 61, "electronics" should read --electronic--.
Line 66, "electronics" should read --electronic--

Signed and Sealed this

Eighteenth Day of April, 1989

Attest:

DONALD J. QUIGG

Attesting Officer

Commissioner of Patents and Trademarks